United States Patent
Mesuda et al.

(10) Patent No.: US 7,067,221 B2
(45) Date of Patent: Jun. 27, 2006

(54) DESIGNING METHOD AND DEVICE FOR PHASE SHIFT MASK

(75) Inventors: Kei Mesuda, Tokyo (JP); Nobuhito Toyama, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 310 days.

(21) Appl. No.: 10/373,569

(22) Filed: Feb. 25, 2003

(65) Prior Publication Data

US 2004/0101766 A1 May 27, 2004

(30) Foreign Application Priority Data

Mar. 1, 2002 (JP) .................................... 2002-055542

(51) Int. Cl.
*G01F 9/00* (2006.01)
*G03C 5/00* (2006.01)

(52) U.S. Cl. .......................................... 430/5; 430/323
(58) Field of Classification Search .................. 430/5, 430/322, 323, 324; 716/19, 21
See application file for complete search history.

(56) References Cited

U.S. PATENT DOCUMENTS 6,720,114 B1 * 4/2004 Winder et al. ................. 430/5
6,780,568 B1 * 8/2004 Nistler et al. ................ 430/311

FOREIGN PATENT DOCUMENTS

| JP | 2003-177504 | 6/2003 |
| WO | JP02/12932 | 10/2002 |

\* cited by examiner

*Primary Examiner*—S. Rosasco
(74) *Attorney, Agent, or Firm*—Ladas and Parry LLP

(57) ABSTRACT

The work load spent on designing a trench-type, Levenson-type phase shift mask is lightened and the working time for the designing process is shortened. A pattern 11, having a plurality of apertures, is designed by means of a designing tool 10. In a database 30 are prepared optimal functions that indicate optimal combinations of undercut amounts Uc and bias correction amounts δ according to each set of dimension conditions. An optimal function extraction tool 20 extracts optimal functions Fp and Fs that are matched with dimension conditions Mp and Ms on pattern 11, and determining tool 40 determines optimal values of the undercut amount Uc and the bias correction amount δ based on the extracted optimal function. A three-dimensional structure determining tool 50 determines a three-dimensional structural body 13, having a depth d and the undercut amount Uc, for an aperture by which the phase of transmitted light is shifted by 180 degrees. Pattern correction tool 60 uses the bias correction amount δ to perform correction of the width of an aperture on pattern 11 and thereby provides a corrected pattern 12.

12 Claims, 15 Drawing Sheets

LIGHT INTENSITY DEVIATION
D = Wa − Wb

LIGHT INTENSITY DEVIATION
D = Wa − Wb = 0

Fig.14

TWO-DIMENSIONAL DIMENSION CONDITIONS : Wx = 400nm, Wy = 4000nm, Ws = 400nm

| BIAS CORRECTION AMOUNT δ (nm) \ UNDERCUT AMOUNT Uc (nm) | 0.0 | 10.0 | 20.0 | 30.0 | 40.0 | 50.0 | 60.0 | 70.0 | 80.0 | 90.0 | 100.0 | 110.0 | 120.0 | 130.0 | 140.0 | 150.0 | 160.0 |
|---|---|---|---|---|---|---|---|---|---|---|---|---|---|---|---|---|---|
| 0.0 | 30.5 | 25.3 | 20.1 | 14.8 | 9.6 | 8.2 | 7.1 | 6.0 | 4.9 | 4.2 | 3.5 | 2.6 | 1.7 | 0.9 | 0.2 | -0.6 | -1.4 |
| 5.0 | 26.9 | 22.1 | 17.4 | 12.7 | 7.9 | 5.1 | 4.0 | 2.9 | 1.9 | 1.0 | 0.2 | -0.8 | -1.8 | -2.7 | -3.6 | -4.5 | -5.4 |
| 10.0 | 23.3 | 19.0 | 14.8 | 10.5 | 6.2 | 2.0 | 0.9 | -0.1 | -1.2 | -2.2 | -3.2 | -4.3 | -5.3 | -6.4 | -7.4 | -8.5 | -9.5 |
| 15.0 | 19.7 | 15.5 | 11.4 | 7.3 | 3.2 | -0.9 | -1.9 | -3.0 | -4.0 | -5.0 | -6.1 | -7.1 | -8.1 | -9.2 | -10.2 | -11.3 | -12.3 |
| 20.0 | 16.1 | 12.1 | 8.1 | 4.1 | 0.1 | -3.8 | -4.8 | -5.8 | -6.8 | -7.8 | -8.9 | -9.9 | -10.9 | -12.0 | -13.0 | -14.1 | -15.1 |
| 25.0 | 12.4 | 8.6 | 4.7 | 0.9 | -3.0 | -6.9 | -7.8 | -8.8 | -9.8 | -10.9 | -11.9 | -12.9 | -14.0 | -15.0 | -16.1 | -17.1 | -18.2 |
| 30.0 | 8.8 | 5.1 | 1.3 | -2.4 | -6.1 | -9.9 | -10.9 | -11.9 | -12.9 | -13.9 | -14.9 | -16.0 | -17.0 | -18.1 | -19.1 | -20.2 | -21.2 |
| 35.0 | 5.2 | 1.6 | -2.0 | -5.6 | -9.3 | -12.9 | -13.9 | -14.9 | -15.8 | -16.9 | -17.9 | -19.0 | -20.0 | -21.0 | -22.1 | -23.1 | -24.2 |
| 40.0 | 1.7 | -1.8 | -5.3 | -8.9 | -12.4 | -15.9 | -16.9 | -17.8 | -18.8 | -19.9 | -20.9 | -21.9 | -23.0 | -24.0 | -25.1 | -26.1 | -27.2 |
| 45.0 | -1.9 | -5.3 | -8.7 | -12.0 | -15.4 | -18.8 | -19.8 | -20.9 | -21.9 | -23.0 | -24.0 | -25.0 | -26.1 | -27.1 | -28.2 | -29.2 | -30.2 |
| 50.0 | -5.5 | -8.7 | -12.0 | -15.2 | -18.4 | -21.7 | -22.8 | -23.9 | -25.0 | -26.0 | -27.1 | -28.1 | -29.2 | -30.2 | -31.3 | -32.3 | -33.3 |
| 55.0 | -8.9 | -12.1 | -15.2 | -18.4 | -21.6 | -24.8 | -25.8 | -26.8 | -27.8 | -28.9 | -30.0 | -31.0 | -32.1 | -33.1 | -34.1 | -35.2 | -36.2 |
| 60.0 | -12.3 | -15.4 | -18.5 | -21.6 | -24.7 | -27.8 | -28.8 | -29.8 | -30.8 | -31.8 | -32.9 | -33.9 | -34.9 | -36.0 | -37.0 | -38.1 | -39.1 |

DESIGNING METHOD AND DEVICE FOR PHASE SHIFT MASK

BACKGROUND OF THE INVENTION

This invention relates to a designing method and device for phase shift mask, and in particular, relates to an art for correcting drawing data for designing a trench-type, Levenson-type phase shift mask to be used for manufacture of semiconductor devices.

Semiconductor devices are being made higher in density from year to year and the integrated circuit patterns formed on semiconductor wafers are becoming even finer. Exposure using a photomask is normally performed in forming an integrated circuit pattern on a semiconductor wafer, and the pattern on a photomask inevitably becomes finer as the pattern to be exposed becomes finer. Especially since the latter half of the 1990's, technical developments are actively being made towards forming fine shapes of sizes shorter than the light source wavelength of an exposure tool on a semiconductor wafer.

Generally in forming a fine pattern of a size near or no more than an exposure tool's light source wavelength on a semiconductor wafer, the diffraction phenomenon of light cannot be ignored. Specifically, in a case where a pair of mutually adjacent apertures are formed as a photomask pattern, the lights transmitted through the pair of apertures diffract and interfere with each other, causing exposure even at parts that are supposed to be shielded from light. Thus with a photomask on which a fine pattern is formed, measures must be devised in consideration of the diffraction phenomenon of light. A phase shift mask is known as a type of photomask with which such a measure is taken. The basic principle of a phase shift mask is that a structure, with which the phases of the light transmitted through a pair of adjacently disposed apertures will be opposite each other, is employed to cancel out the interference of light. As a method of shifting the phase of light that is transmitted through one of the apertures by 180 degrees with respect to the phase of light that is transmitted through the other aperture, a method of forming a trench in the substrate that makes up the photomask has been proposed. For example, Laid-open Japanese Patent Publication No. 2002-40624 discloses a trench-type, Levenson-type phase shift mask as a typical example of such a phase shift mask. Also, Japanese Patent Application Specification No. 2001-376743, Japanese Patent Application Specification No. 2002-359331, and Specification No. PCT/JP02/12932 disclose arts of combining three-dimensional simulation with two-dimensional simulation using a computer to realize efficient designing of a phase shift mask.

As mentioned above, with a phase shift mask, since the shape of a fine pattern must be determined in consideration of the diffraction phenomenon of light, the design work is complicated. Especially with a trench-type, Levenson-type phase shift mask, in which a trench is formed in a substrate, since the part at which the trench is formed takes on a three-dimensional structure, two-dimensional analysis is insufficient and the need to perform three-dimensional analysis arises. Much labor and time were thus required to design a single phase shift mask.

SUMMARY OF THE INVENTION

An object of this invention is thus to provide a designing method and device for phase shift mask which enable the work load to be lightened and the working time to be shortened.

(1) The first feature of the present invention resides in a method for designing a phase shift mask, the phase shift mask having a substrate with a transparent property and an opaque layer having an opaque property formed on the substrate, wherein a plurality of rectangular apertures are formed in the opaque layer, a two-dimensional layout pattern is formed by opaque parts comprising regions at which the opaque layer is formed and transparent parts comprising regions at which the apertures are formed, and for a pair of adjacently disposed apertures, a trench having a predetermined depth and an outline greater than an outline of an aperture is formed at a portion of the substrate at which a first aperture is formed so that a phase of light transmitted through the first aperture will be shifted by 180 degrees with respect to a phase of light transmitted through a second aperture:

the phase shift mask designing method comprising a preparation step for preparing a function necessary for designing and a designing step in which designing is actually carried out using the function;

the preparation step comprising:

an exposure condition setting step for setting an exposure condition for use of the phase shift mask to be designed;

a two-dimensional dimension condition setting step for defining an X-Y plane having an X-axis and a Y-axis on a surface of the substrate and setting a two-dimensional dimension condition M that determines specific dimension values for a width Wx in the X-axis direction and a width Wy in the Y-axis direction of each aperture and a width Ws of each opaque part;

an undercut amount setting step for setting an undercut amount Uc that indicates a distance between a position of an outline of the trench and a position of an outline of the aperture;

a bias correction amount setting step for setting a bias correction amount δ that indicates an amount of increase or decrease of an aperture width that is set by the two-dimensional dimension condition M;

a three-dimensional analysis step for executing, on each of a plurality of cases in which the two-dimensional dimension condition M, the undercut amount Uc, and the bias correction amount δ are changed in a plurality of ways, a three-dimensional analysis of defining a two-dimensional layout, in which a plurality of apertures of the same size are disposed along the X-axis on the X-Y plane based on a dimension condition obtained by applying a correction in accordance with a predetermined bias correction amount δ on the predetermined dimension condition M, defining a three-dimensional structure for an aperture with which phase shifting is to be performed based on a predetermined undercut amount Uc and a trench depth d that is determined based on the exposure condition, and determining a light intensity deviation D, which indicates, for a case where light is transmitted under the exposure condition through a pair of adjacent apertures that have been designed using a three-dimensional structural body that is defined by the two-dimensional layout and the three-dimensional structure, a difference in intensities of light that has been transmitted through the pair of adjacent apertures; and an optimal function defining step for comparing a plurality of light intensity deviations D, which have been determined under a specific two-dimensional dimension condition M in the three-dimensional analysis step, with each other, determining, for each of a plurality of undercut amounts Uc, a bias correction amount δ by which the light intensity deviation D is minimized as an optimal value for the specific two-dimensional dimension condition M, and determining, for each of a plurality of two-dimensional dimension conditions M, an optimal function that indicates an optimal value of a bias correction amount δ with respect to an undercut amount Uc; and the designing step comprising:

a two-dimensional layout pattern designing step for designing a two-dimensional layout pattern, wherein a plurality of apertures are disposed on a two-dimensional plane, and determining for each aperture, whether or not phase shifting is to be performed;

an optimal function extracting step for selecting, from among a plurality of two-dimensional dimension conditions M for which the optimal functions are determined, a condition that can be applied to the two-dimensional layout pattern and extracting an optimal function determined for the selected two-dimensional dimension condition M;

an optimal value determination step for determining optimal values of an undercut amount Uc and a bias correction amount δ based on the extracted optimal function;

a layout correction step for correcting the two-dimensional layout pattern based on the optimal value of the bias correction amount δ; and a three-dimensional structure determination step for determining a three-dimensional structure for an aperture with which phase shifting is to be performed based on the optimal value of the undercut amount Uc and a trench depth d that is determined based on the exposure condition.

(2) The second feature of the present invention resides in a method for designing a phase shift mask according to the first feature, wherein the three-dimensional analysis step is executed by simulation using a computer and the light intensity deviations D are obtained as values computed by a computer.

(3) The third feature of the present invention resides in a method for designing a phase shift mask according to the first feature, wherein the three-dimensional analysis step is executed by experiments of actually illuminating light onto a physically prepared three-dimensional structural bodies and the light intensity deviations D is obtained as values that are actually measured in these experiments.

(4) The fourth feature of the present invention resides in a method for designing a phase shift mask according to the first feature, wherein in the three-dimensional analysis step, the light intensity deviation D is defined as a difference obtained by subtracting, from a parameter value indicating an intensity of light transmitted through a first aperture, a parameter value indicating an intensity of light transmitted through a second aperture; and in the optimal function defining step, the bias correction amount δ, with which an absolute value of a light intensity deviation D for a specific undercut amount Uc is minimized, is set as an optimal value for the specific undercut amount Uc.

(5) The fifth feature of the present invention resides in a method for designing a phase shift mask according to the first feature, wherein in the optimal function defining step, an upper limit of an undercut amount Uc and an upper limit of a bias correction amount δ are defined for each two-dimensional dimension condition M and a definition range and a value range of each optimal function are defined to be less than or equal to the corresponding upper limit.

(6) The sixth feature of the present invention resides in a method for designing a phase shift mask according to the first feature, wherein in the optimal function defining step, an optimal function is defined as a table indicating a correspondence between specific undercut amounts Uc and specific bias correction amounts δ that are optimal values for the specific undercut amounts Uc.

(7) The seventh feature of the present invention resides in a method for designing a phase shift mask according to the first feature, wherein in the optimal function defining step, an optimal function is defined as an equation that approximates a correspondence between specific undercut amounts Uc and specific bias correction amounts δ that are optimal values for the specific undercut amounts Uc.

(8) The eighth feature of the present invention resides in a method for designing a phase shift mask according to the first feature, wherein in the optimal function extracting step, a plurality of two-dimensional dimension conditions M are selected to extract a plurality of optimal functions; and in the optimal value determining step, two-dimensional graphs of the plurality of optimal functions are defined by setting an undercut amount Uc as an abscissa and a bias correction amount δ as an ordinate, an optimal value of the undercut amount Uc is set to a coordinate value of an abscissa position at which the plurality of graphs approach each other the most, and an optimal value of the bias correction amount δ is set to an average value of ordinate values of intersections of a vertical line drawn at the abscissa position and the respective graphs.

(9) The ninth feature of the present invention resides in a method for designing a phase shift mask according to the eighth feature, wherein in the optimal function extracting step, a plurality of two-dimensional dimension conditions M are selected upon defining respective priorities to extract a plurality of optimal functions with the respective priorities being defined; and in the optimal value determining step, an optimal value of the bias correction amount δ is determined as an average value that takes into consideration the respective priorities of the graphs of the optimal functions.

(10) The tenth feature of the present invention resides in a method for designing a phase shift mask according to the first feature, wherein in the optimal function extracting step, a plurality of two-dimensional dimension conditions M are selected to extract a plurality of optimal functions; and in the optimal value determining step, two-dimensional graphs of the plurality of optimal functions are defined by setting an undercut amount Uc as an abscissa and a bias correction amount δ as an ordinate, a coordinate value of a predetermined abscissa position is set as a single optimal value of the undercut amount Uc in common to the plurality of two-dimensional dimension conditions M, and for the bias correction amount δ, a unique optimal value is determined for each two-dimensional dimension condition M based on an ordinate value of an intersection of a vertical line drawn at the abscissa position and a corresponding graph, respectively.

(11) The eleventh feature of the present invention resides in a method for designing a phase shift mask according to the first feature, wherein as the bias correction amount δ, a first correction amount δ1, which indicates an amount of increase of a dimension of an aperture with which phase shifting is to be performed, and a second correction amount δ2, which indicates an amount of decrease of a dimension of an aperture with which phase shifting is not to be performed, are set.

(12) The twelfth feature of the present invention resides in a method for designing a phase shift mask according to the eleventh feature, wherein the first correction amount 6 1 and the second correction amount δ2 are set to an equal value.

(13) The thirteenth feature of the present invention resides in a device for designing a phase shift mask, the phase shift mask having a substrate with a transparent property and an opaque layer having an opaque property formed on the substrate, wherein a plurality of rectangular apertures are formed in the opaque layer, a two-dimensional layout pattern is formed by opaque parts comprising regions at which the opaque layer is formed and transparent parts comprising regions at which the apertures are formed, and for a pair of adjacently disposed apertures, a trench having a predetermined depth and an outline greater than an outline of an aperture is formed at a portion of the substrate at which a first aperture is formed so that a phase of light transmitted through the first aperture will be shifted by 180 degrees with respect to a phase of light transmitted through a second aperture:

the phase shift mask designing device comprising;

a two-dimensional layout pattern designing tool which, based on instructions from an operator, designs a two-dimensional layout pattern wherein a plurality of apertures are disposed on an X-Y plane having an X-axis and a Y-axis defined on a surface of the substrate, and determines for each aperture whether or not phase shifting is to be performed;

an optimal function database, which stores a predetermined optimal function for each of a plurality of two-dimensional dimension conditions M for determining specific dimension values for a width Wx in the X-axis direction and a width Wy in the Y-axis direction of each aperture and a width Ws of each opaque part;

an optimal function extracting tool, which, based on instructions from the operator, selects two-dimensional dimension condition M that can be applied to the two-dimensional layout pattern designed by the two-dimensional layout pattern designing tool and extracts an optimal function for the selected two-dimensional dimension condition M from the optimal function database;

an undercut amount/bias correction amount determining tool, which, based on the extracted optimal function, determines an undercut amount Uc that indicates a distance between a position of an outline of the trench and a position of an outline of the aperture and a bias correction amount δ that indicates an amount of increase or decrease of a width of an aperture on the two-dimensional layout pattern designed by the two-dimensional layout pattern designing tool;

a three-dimensional structure determining tool, which, based on the undercut amount Uc that is determined by the undercut amount/bias correction amount determining tool and a trench depth d that is determined based on a predetermined exposure condition, determines a three-dimensional structure concerning an aperture with which phase shifting is to be performed; and a two-dimensional layout pattern correcting tool, which, based on the bias correction amount δ determined by the undercut amount/bias correction amount determining tool, corrects the two-dimensional layout pattern designed by the two-dimensional layout pattern designing tool;

wherein in the optimal function database, a function indicating optimal values of the bias correction amount δ with respect to undercut amounts Uc within a predetermined range is stored as an optimal function for each two-dimensional dimension condition M.

(14) The fourteenth feature of the present invention resides in a device for designing a phase shift mask according to the thirteenth feature, wherein the optimal function extracting tool selects a plurality of two-dimensional dimension conditions M to extract a plurality of optimal functions; and the undercut amount/bias correction amount determining tool defines two-dimensional graphs of the plurality of optimal functions by setting an undercut amount Uc as an abscissa and a bias correction amount δ as an ordinate, sets an optimal value of the undercut amount Uc to an ordinate value of the abscissa position at which the plurality of graphs approach each other the most, and sets an optimal value of the bias correction amount δ to an average value of an ordinate values of intersections of a vertical line drawn at the abscissa position and the respective graphs.

(15) The fifteenth feature of the present invention resides in a device for designing a phase shift mask according to the fourteenth feature, wherein based on instructions from the operator, the optimal function extracting tool selects a plurality of two-dimensional dimension conditions M upon defining respective priorities to extract a plurality of optimal functions with the respective priorities being defined; and the undercut amount/bias correction amount determining tool determines an optimal value of the bias correction amount δ as an average value that takes into consideration the respective priorities of the graphs of the optimal functions.

(16) The sixteenth feature of the present invention resides in a device for designing a phase shift mask according to the thirteenth feature, wherein the optimal function extracting tool selects a plurality of two-dimensional dimension conditions M to extract a plurality of optimal functions;

the undercut amount/bias correction amount determining tool defines two-dimensional graphs of the plurality of optimal functions by setting an undercut amount Uc as an abscissa and a bias correction amount δ as an ordinate, sets a coordinate value of a predetermined abscissa position as a single optimal value of the undercut amount Uc in common to the plurality of two-dimensional dimension conditions M, and for the bias correction amount δ, determines a unique optimal value for each two-dimensional dimension condition M based on an ordinate value of an intersection of a vertical line drawn at the abscissa position and a corresponding graph; and the two-dimensional layout pattern correcting tool performs correction using each bias correction amount δ according to a layout pattern region to which a corresponding two-dimensional dimension condition M is applied.

(17) The seventeenth feature of the present invention resides in a device for designing a phase shift mask according to the thirteenth feature, wherein as the bias correction amount δ, a first correction amount δ1, which indicates an amount of increase of a dimension of an aperture with which phase shifting is to be performed, and a second correction amount δ2, which indicates an amount of decrease of a dimension of an aperture with which phase shifting is not to be performed, are set.

(18) The eighteenth feature of the present invention resides in a device for designing a phase shift mask according to the seventeenth feature, wherein the first correction amount δ1 and the second correction amount δ2 are set to an equal value.

BRIEF DESCRIPTION OF THE DRAWINGS

FIG. 14 is a table of light intensity deviation values D (unit: nm) obtained as a result of performing a three-dimensional simulation, with which the undercut amount Uc and the bias correction amount δ are varied in a plurality of ways with the two-dimensional dimension condition being fixed at Wx=400 nm, Wy=4000 nm, and Ws=400 nm and under predetermined exposure condition.

DISCLOSURE OF THE PREFERRED EMBODIMENTS

This invention shall now be described based on the illustrated embodiments.

<<<§1. Basic Structure of a Phase Shift Mask >>>

Figure 1:
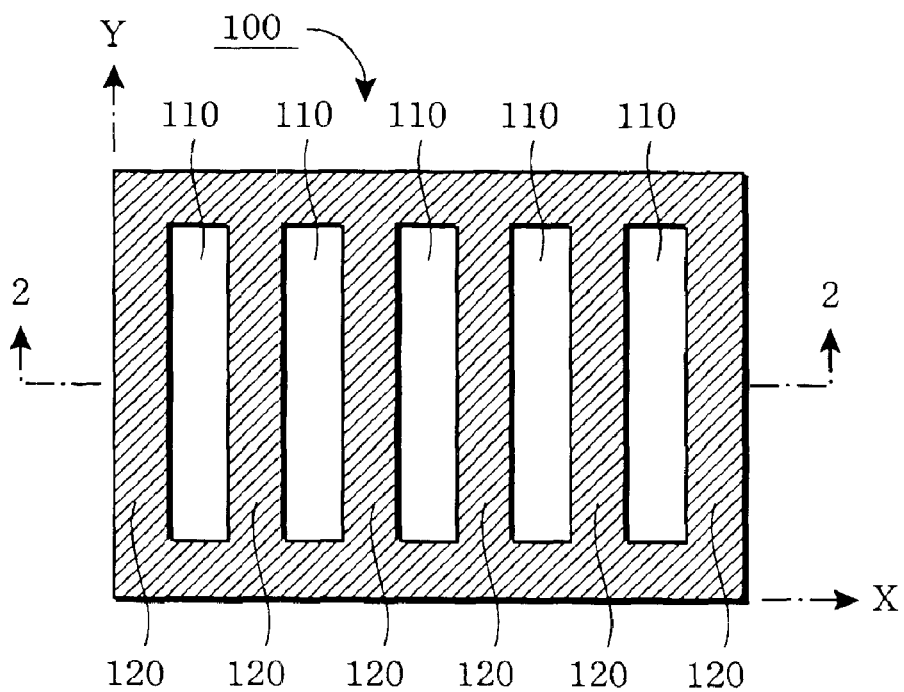
FIG. 1 is a plan view, showing a photomask with a general, two-dimensional layout pattern (the hatching indicates opaque parts and not cross sections).

A photomask used for forming an integrated circuit pattern on a semiconductor wafer is basically a two-dimensional layout pattern arranged from opaque parts and transparent parts. FIG. 1 is a plan view, showing a photomask with such a two-dimensional layout pattern. An opaque layer 100 is formed on the upper surface of this photomask and this opaque layer has the two regions of transparent parts 110 and opaque parts 120. As illustrated, each transparent part 110 is arranged as a rectangular aperture and opaque parts 120 are arranged in the form of a frame that surrounds these apertures. The hatched parts in the Figure indicate the regions of opaque parts 120 and not cross sections.

Figure 2:
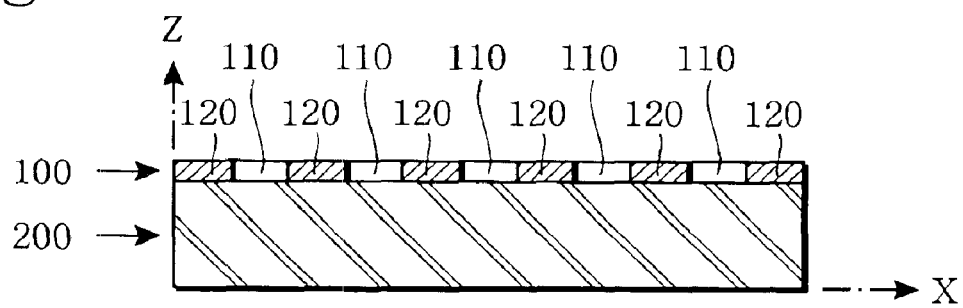
FIG. 2 is a sectional side view, showing a section along line 2—2 of the photomask shown in FIG. 1.

FIG. 2 is a sectional side view, showing the section along line 2—2 of the photomask shown in FIG. 1. As is illustrated, this photomask is arranged from a transparent substrate 200 and an opaque layer 100, which has an opaque property and is formed on substrate 200. Substrate 200 is formed of a material such as quartz glass, etc., and opaque layer 100 is formed of a material such as a metal film of chromium, etc. Transparent parts 110 are aperture parts formed in opaque layer 100. When light from an exposure tool is illuminated under predetermined illumination conditions onto this photomask, the light is shielded at the portions of opaque parts 120 and transmitted only through the portions of transparent parts 110.

Figure 3:
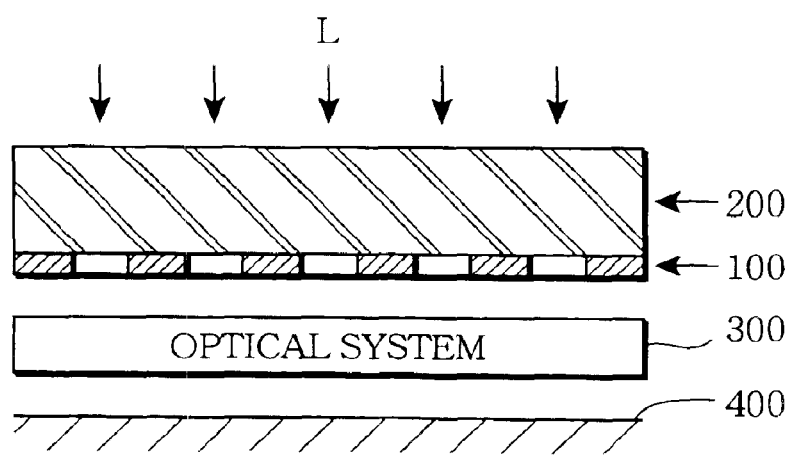
FIG. 3 is a sectional side view, illustrating the exposure work that is performed using the photomask shown in FIG. 1 (optical system 300 is indicated as a block).

FIG. 3 is a sectional side view, illustrating the exposure work that is performed using this photomask. As is illustrated, the photomask is normally positioned so that substrate 200 will be at the upper side and opaque layer 100 will be at the lower side and the light L from the exposure tool is illuminated from above. Also, a prescribed optical system 300 (indicated as a block in the Figure) is disposed below the photomask, and the light that is transmitted through the photomask is illuminated onto an exposed surface 400 of a semiconductor wafer via this optical system 300. As a result, exposed surface 400 is exposed to a two-dimensional layout pattern, such as that shown in FIG. 1.

For the sake of convenience, the X-axis shall be set, as shown in FIG. 1, in the transverse direction of the Figure, the Y-axis shall be set in the vertical direction of the Figure, the X-Y plane shall be defined as the surface of substrate 200, and the two-dimensional layout pattern formed by opaque layer 100 shall be the pattern defined on this X-Y plane in the description that follows. As shown in FIG. 2, the Z-axis is thus defined in the direction perpendicular to the main surface of substrate 200 and the light L from the exposure tool is thus illuminated in the Z-axis direction.

The two-dimensional layout pattern shown in FIG. 1 is a typical pattern called a "line and space pattern" with which a plurality of apertures of the same size are disposed along the X-axis. This invention is premised on designing a photomask containing such a two-dimensional layout pattern in which a plurality of rectangular apertures of the same size are disposed along the X-axis.

A two-dimensional layout pattern for an actual semiconductor integrated circuit is not necessarily arranged from just such a pattern in which a plurality of rectangular apertures of the same size are disposed and it is not rare for a pattern to take on a form where L-shaped apertures, U-shaped apertures, and other apertures of irregular shape coexist as necessary. However, a "line and space pattern" in which a plurality of rectangular apertures of the same size are disposed, is a pattern that is most frequently used in practical applications as a two-dimensional layout pattern for a general semiconductor integrated circuit and it is not an overstatement to say that most regions are taken up by such a "line and space pattern". The designing method of the present invention is an art that can be used widely in designing such a "line and space pattern" part and is an art of extremely high value of use in designing a photomask for a general semiconductor integrated circuit.

Though for the sake of convenience, the example shown in FIG. 1 is a comparatively simple example in which rectangular apertures are formed at five locations, in actuality, a layout pattern, with which a larger number of apertures are disposed along the X-axis at a predetermined pitch, is generally used.

In a case where a photomask such as that shown in FIG. 1 is prepared with the dimensions that are actually indicated in the drawing, the light L that is illuminated from the exposure tool in FIG. 3 behaves as particles and the light that is transmitted through an aperture of opaque layer 100 proceeds rectilinearly as it is and exposes the surface of exposed surface 400. An exposure pattern equivalent to the two-dimensional layout pattern shown in FIG. 1 is thus obtained on the exposed surface 400. However, circumstances will differ if the respective parts of the pattern of a photomask such as that shown in FIG. 1 are prepared with a size near or no more than the wavelength of the light source of the exposure tool. When the size of an aperture becomes close to the wavelength of light, the light L that is illuminated from the exposure tool begins to behave as a wave and the diffraction phenomenon that occurs in the process of transmission through the aperture becomes non-negligible.

Figure 4:
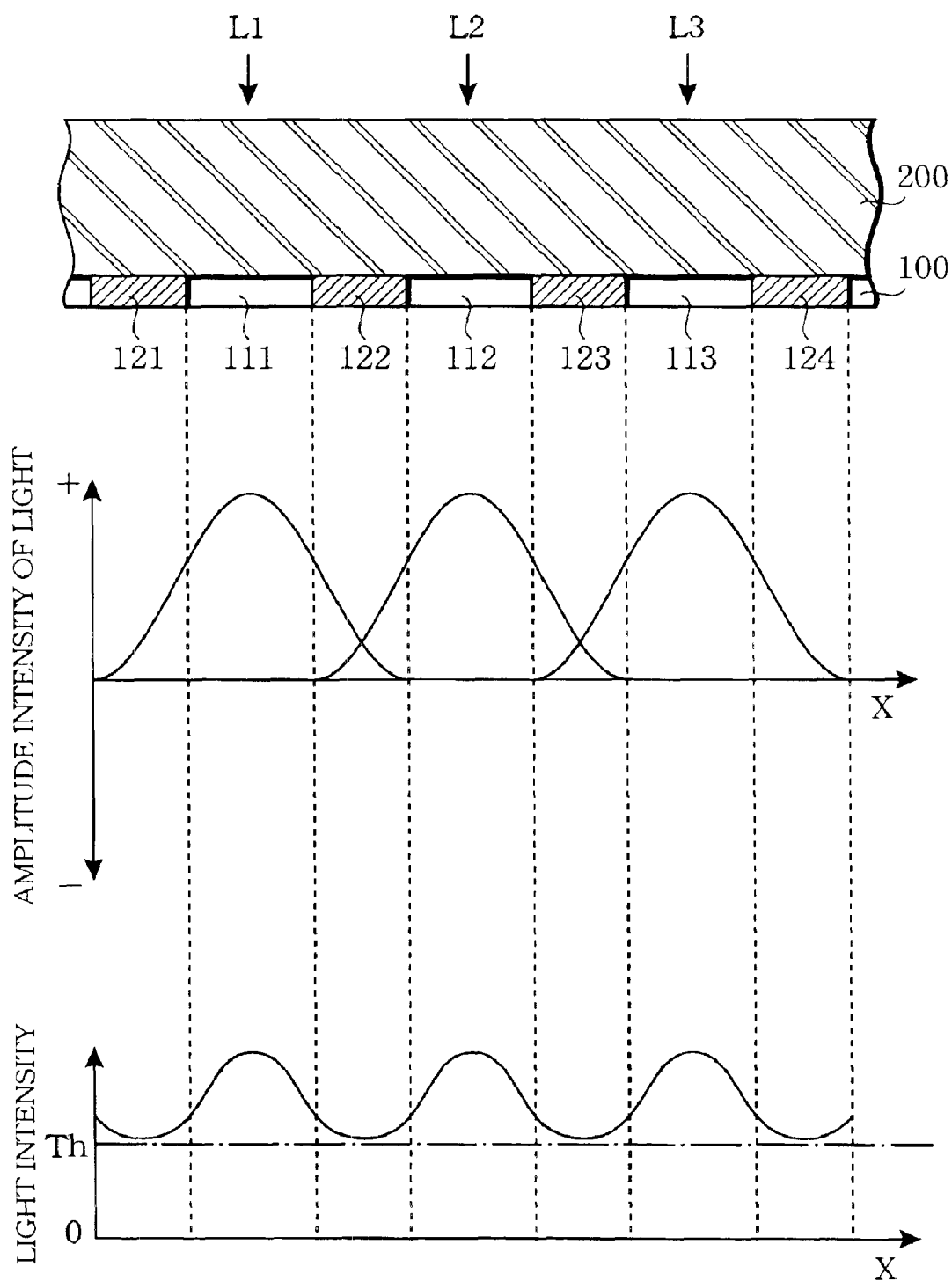
FIG. 4 shows diagrams that illustrate the behavior of light transmitted through apertures of a photomask with the occurrence of diffraction phenomenon taken into consideration, the upper diagram being a partially enlarged sectional side view of the photomask, the middle diagram showing graphs of the amplitude intensity distributions of the light transmitted through the photomask, and the lower diagram being a graph, showing the light intensity distribution of the light transmitted through the photomask.

FIG. 4 shows diagrams that illustrate the behavior of light transmitted through apertures of a photomask with the occurrence of diffraction phenomenon taken into consideration, the upper diagram being a partially enlarged sectional side view of the photomask, the middle diagram showing graphs of the amplitude intensity distributions of the light transmitted through the photomask, and the lower diagram showing a graph of the light intensity distribution of the light transmitted through the photomask.

As shown in the upper diagram of the Figure, though illumination light L1, L2, and L3 from the exposure tool are respectively transmitted through apertures 111, 112, and 113 and proceed toward the exposed surface below the photomask, since the diffraction phenomenon of light occurs in this process, parts of the transmitted light become diffracted towards portions of opaque parts 121, 122, 123, and 124. As a result, the amplitude intensity of light (here, the amplitude intensity that takes the sign into consideration is illustrated) will be as shown in the graph of the middle diagram. The abscissa of these graphs corresponds to the spatial position in the X-axis direction of the photomask, and it can be seen that amplitude intensities with peaks at the central positions of the respective apertures 111, 112, and 113 are obtained.

Since all of the light that are thus transmitted through the photomask are light of the same phase, they intensify each other at the overlapping parts of the graphs of the middle diagram of the Figure, and consequently, the light intensity distribution of the transmitted light will be that of the graph of the lower diagram of the Figure that is obtained by adding the amplitude intensity values of the respective graphs. That is, though the light intensity at the regions of the exposed surface of the semiconductor wafer that correspond to the respective apertures 111, 112, and 113 will be relatively high, the light intensity will also come to take on a certain magnitude even at regions corresponding to opaque parts 121, 122, 123, and 124. Thus, if for example the threshold value Th of the light intensity that is necessary for exposing a resist layer that is formed on the exposed surface is of the value indicated in the graph of the lower diagram of the Figure, all regions of the exposed surface will be exposed in the case of the illustrated example and the image of the original pattern will not be formed.

Figure 5:
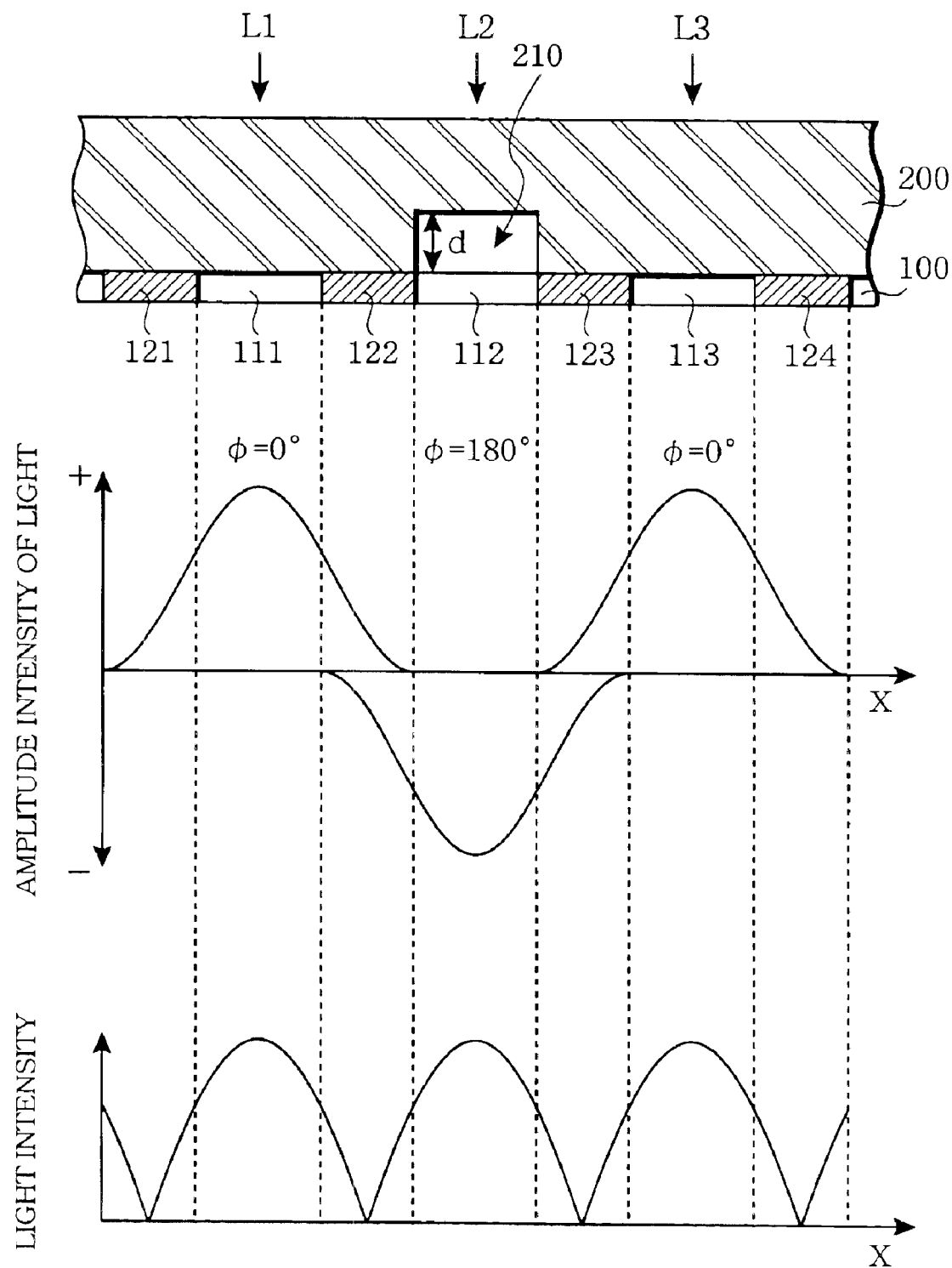
FIG. 5 shows diagrams that illustrate the ideal behavior of light transmitted through apertures of a phase shift mask with the occurrence of diffraction phenomenon taken into consideration, the upper diagram being a partially enlarged sectional side view of the phase shift mask, the middle diagram showing graphs of the amplitude intensity distributions of the light transmitted through this phase shift mask, and the lower diagram being a graph, showing the light intensity distribution of the light transmitted through this phase shift mask.

A phase shift mask is used as a method for counteracting such a problem. FIG. 5 shows diagrams that illustrate the behavior of light transmitted through apertures of a phase shift mask under predetermined conditions and with the occurrence of diffraction phenomenon taken into consideration, the upper diagram being a partially enlarged sectional side view of the phase shift mask, the middle diagram showing graphs of the amplitude intensity distributions of the light transmitted through this phase shift mask, and the lower diagram being a graph, showing the light intensity distribution of the light transmitted through this phase shift mask. The difference between the ordinary photomask shown in the upper diagram of FIG. 4 and the phase shift mask shown in the upper diagram of FIG. 5 is that, with the latter, a trench 210 of a depth d is formed at apart of substrate 200. With the illustrated example, trench 210 is formed at a region in which aperture 112 is formed and a trench is not formed at regions in which apertures 111 and 113 are formed.

Here, trench 210 serves to shift the phase of light L2 that is transmitted through aperture 112 by 180 degrees. In other words, the depth d of trench 210 is set to a length that is necessary for shifting the phase of light of the wavelength of the light source of the exposure tool by just 180 degrees. When illumination light L1, L2, and L3 from the exposure tool are illuminated onto such a phase shift mask, though these light are transmitted through apertures 111, 112, and 113 and proceed toward the exposed surface below the photomask, the light L2 that is transmitted through aperture 112 will be shifted in phase by just 180 degrees. Here, the phases φ of the light L1 and L3 that are transmitted through apertures 111 and 113 are indicated as taking on the reference value of 0 degree and the phase of the light L2 that is transmitted through aperture 112 is indicated as being 180 degrees. When a phase shift occurs with part of such light that are transmitted through the phase shift mask, the amplitude intensities that take the signs of the transmitted light into consideration will be as shown by the graphs of the middle diagram of the Figure. Since the phase of light L2 is inverted with respect to the phases of light L1 and L3, the sign of its amplitude will be inverted as well.

Consequently, the overlapping parts of the graphs shown in the middle diagram of the Figure weaken each other and the synthesized amplitude will be a result of addition of the amplitude intensity values of the graphs in consideration of the signs of the values. Since the light intensity distribution of transmitted light is the square of the amplitude, it will be as shown in the graph of the lower diagram of the Figure. The light intensity will thus be relatively high at regions of the exposed surface of the semiconductor wafer that correspond to the respective apertures 111, 112, and 113 and be relatively low at regions corresponding to opaque parts 121, 122, 123, and 124. If such an adequate difference in light intensity can be obtained between regions corresponding to apertures and regions corresponding to opaque parts, an image of the originally intended pattern can be formed on the exposed surface.

The basic principle of a phase shift mask is thus to employ a structure, such that the phases of light transmitted through a pair of adjacently disposed apertures will be inverted, to cancel out the interference of light at the opaque parts. With a trench type phase shift mask, the method, wherein, for a pair of adjacently disposed apertures, a trench, having a predetermined depth d, is formed at the substrate part at which one of the apertures is formed so that the phase of the light transmitted through this one aperture will be shifted by 180 degrees with respect to the phase of the light transmitted through the other aperture, is taken.

Figure 6:
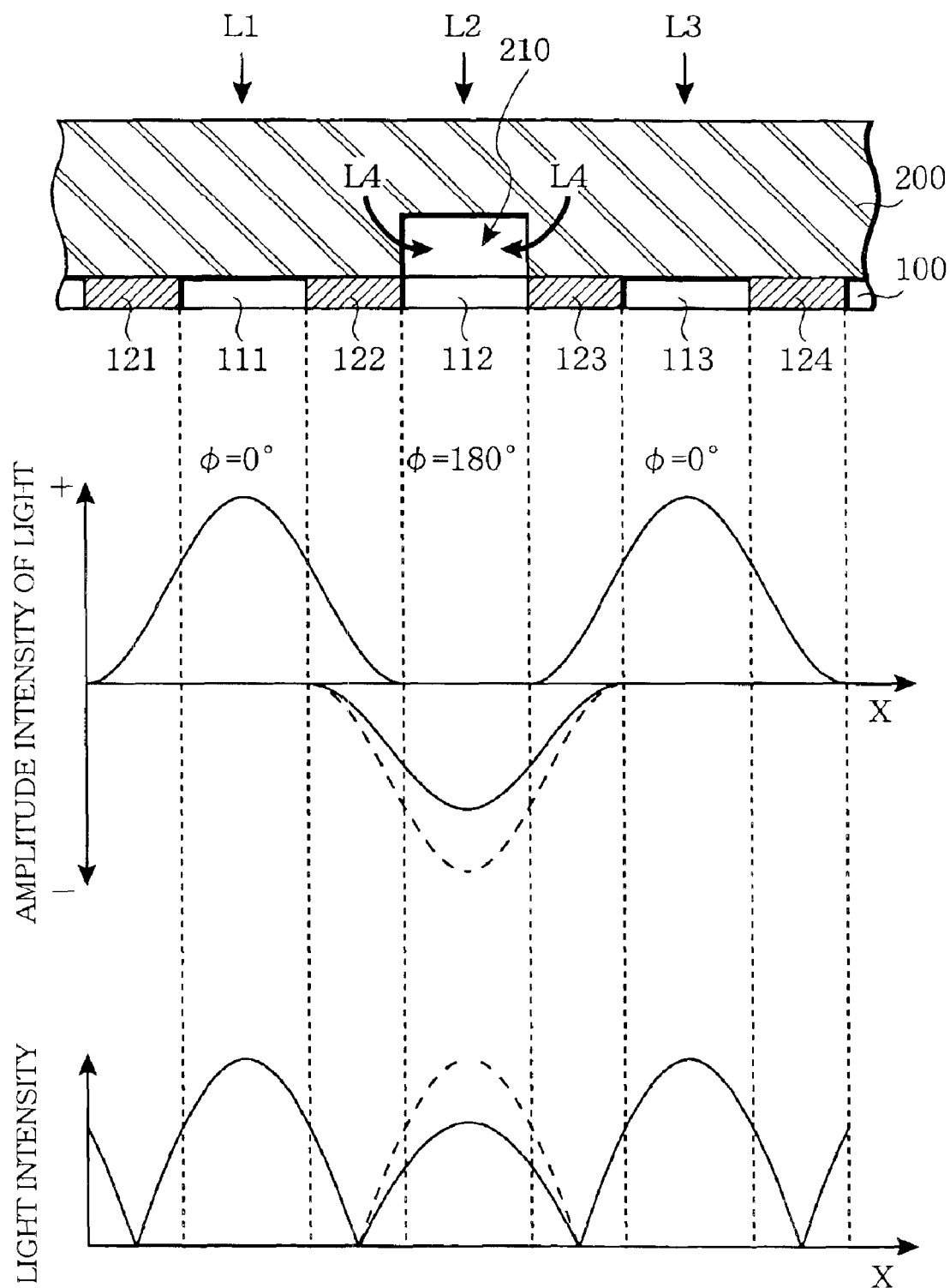
FIG. 6 shows diagrams that illustrate the real behavior of light transmitted through apertures of a phase shift mask with the occurrence of diffraction phenomenon taken into consideration, the upper diagram being a partially enlarged sectional side view of the phase shift mask, the middle diagram showing graphs of the amplitude intensity distributions of the light transmitted through this phase shift mask, and the lower diagram being a graph, showing the light intensity distribution of the light transmitted through this phase shift mask.

However, it is known that, in actuality, when a trench 210 such as that shown in the upper diagram of FIG. 5 is formed, an ideal light intensity distribution such as that shown in the lower diagram of FIG. 5 will not be obtained. FIG. 6 shows diagrams that illustrate the real behavior of light transmitted through apertures of a phase shift mask. With the middle diagram of FIG. 6, though the graph indicated by a broken line indicates the ideal amplitude intensity distribution shown in FIG. 5, in actuality, the amplitude intensity will be smaller as indicated by the solid line in this diagram. Likewise, with the lower diagram of FIG. 6, though the graph indicated by a broken line indicates the ideal light intensity distribution shown in FIG. 5, in actuality, the light intensity will be smaller as indicated by the solid line in this diagram.

Such lowering of the amplitude intensity of light transmitted through trench 210 is due to the existence of light L4 that proceed downwards from the side faces of trench 210 as shown in the upper diagram of FIG. 6. That is, since the light L4, which leak from the side faces of trench 210 are light that differ in phase from the light L2 that proceeds in the vertical direction from the upper side to the lower side of the diagram inside trench 210, the two types of light cancel each other out. As a result, the amplitude intensity of light L2 transmitted through aperture 112 is decreased. Meanwhile, for light L1 and L2 that are transmitted through apertures 111 and 113 in which a trench is not formed, the amplitude intensities do not decrease since such a canceling-out phenomenon does not occur.

Consequently, a circumstance arises wherein, in comparison to the intensity of light transmitted through an aperture with a phase setting of φ=0 degree (an aperture in which a trench is not formed), the intensity of light transmitted through an aperture with a phase setting of φ=180 degrees (an aperture in which a trench is formed) is decreased. This thus results in differences in the sizes of aperture patterns formed on the exposed surface despite performing exposure using a photomask with apertures of the same size.

In order to resolve such a problem, with a trench-type, Levenson-type (or Alternating Aperture type) phase shift mask, such a method is taken, wherein, for a pair of adjacently disposed apertures, a trench of a predetermined depth d is formed at the substrate part at which one of the apertures is formed so that the phase of the light transmitted through this one aperture will be shifted by 180 degrees with respect to the phase of the light transmitted through the other aperture and the outline of this trench is set to be greater than the outline of the aperture.

Figure 7:
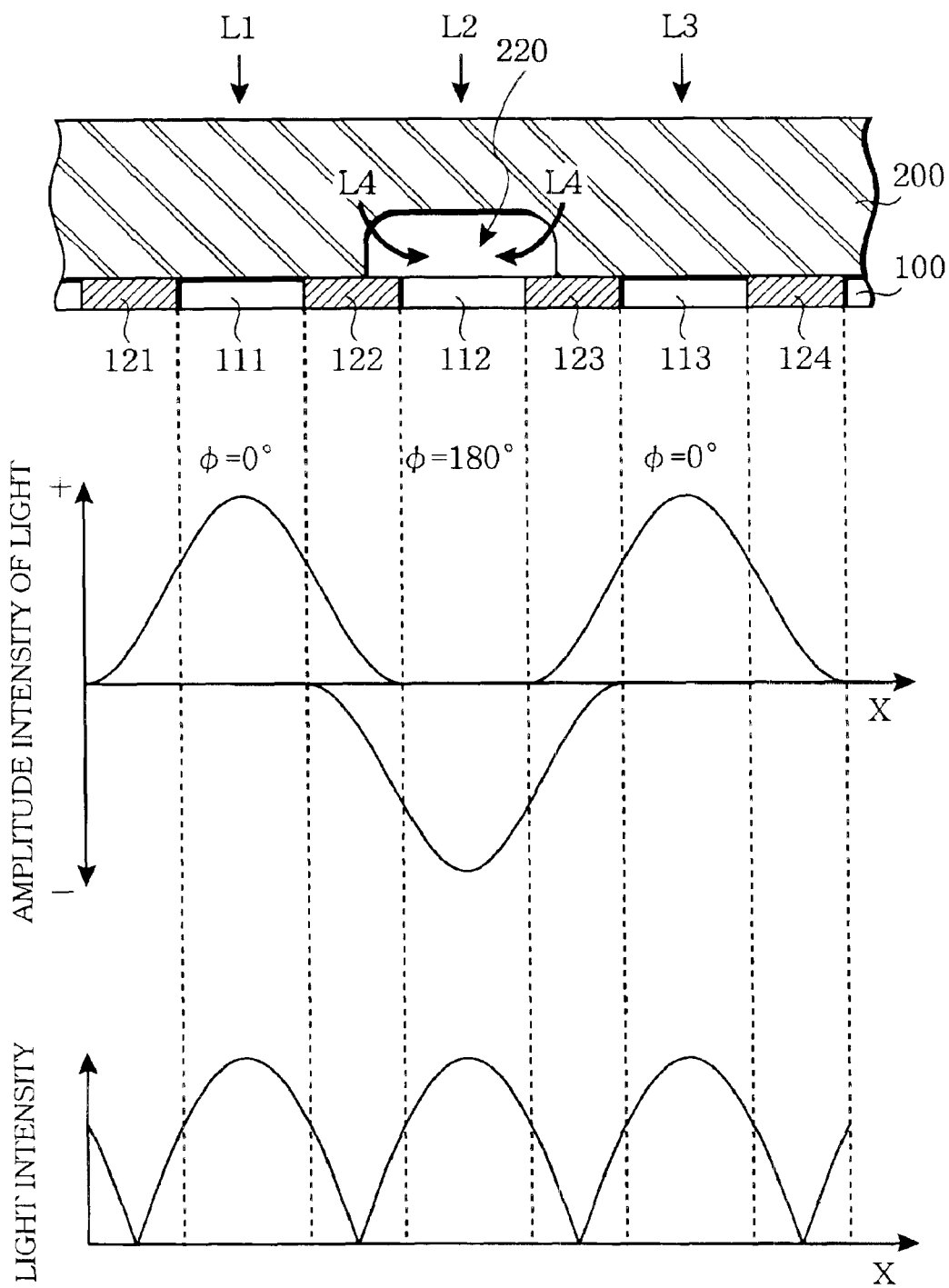
FIG. 7 shows diagrams that illustrate the real behavior of light transmitted through apertures of a trench-type, Levenson-type phase shift mask with the occurrence of diffraction phenomenon taken into consideration, the upper diagram being a partially enlarged sectional side view of the phase shift mask, the middle diagram showing graphs of the amplitude intensity distributions of the light transmitted through this phase shift mask, and the lower diagram being a graph, showing the light intensity distribution of the light transmitted through this phase shift mask.

FIG. 7 shows diagrams that illustrate the real behavior of light transmitted through apertures of a trench-type, Levenson-type phase shift mask. The graphs of amplitude intensity distribution and light intensity distribution shown in the middle and lower diagrams, respectively, of FIG. 7 are the same as the ideal graphs shown in FIG. 5. This is due to the outline (outline on the X-Y plane) of trench 220 being set to be greater than the outline (outline on the X-Y plane) of aperture 112 as shown in the sectional side view of the upper diagram of FIG. 7. With such a structure, since the side faces of trench 220 will be retreated with respect to the outline portion of aperture 112, the light L4 that leak out from the side faces of trench 220 can be prevented from interfering with the light L2 that is transmitted through aperture 112.

Though with the Figures of the present Application, specific graphs concerning light transmitted through a phase shift mask shall be indicated for the sake of convenience of description, the forms of these graphs will differ according to various condition settings. In general, the behavior of light transmitted through a phase shift mask will be affected by the design conditions (two-dimensional dimensions of the apertures, opaque parts, etc.), exposure condition (the values of exposure wavelength, numerical aperture, illumination, etc.), and three-dimensional structures, such as the undercut amount to be described later and the trench depth, etc. The graphs shown in the Figures of the present application illustrate results that are obtained when these various conditions are set to specific conditions.

<<<§2. Problem Concerning the Undercut Amount >>>

As was mentioned already in § 1, by use of a trench-type, Levenson-type phase shift mask with a three-dimensional structure such as that shown in the upper diagram of FIG. 7, the phases of transmitted light can be inverted for a pair of adjacently disposed apertures (the pair of apertures 111 and 112 or the pair of apertures 112 and 113 in the case of the illustrated example) and the influence of interference of the light L4 that leak out from the side from the side faces of the trench can be restrained. However, in actuality, in order to restrain the influence of interference of the light L4 completely, a predetermined value or more must be secured for the distance between the outline position of trench 220 and the outline position of the aperture.

Figure 8:
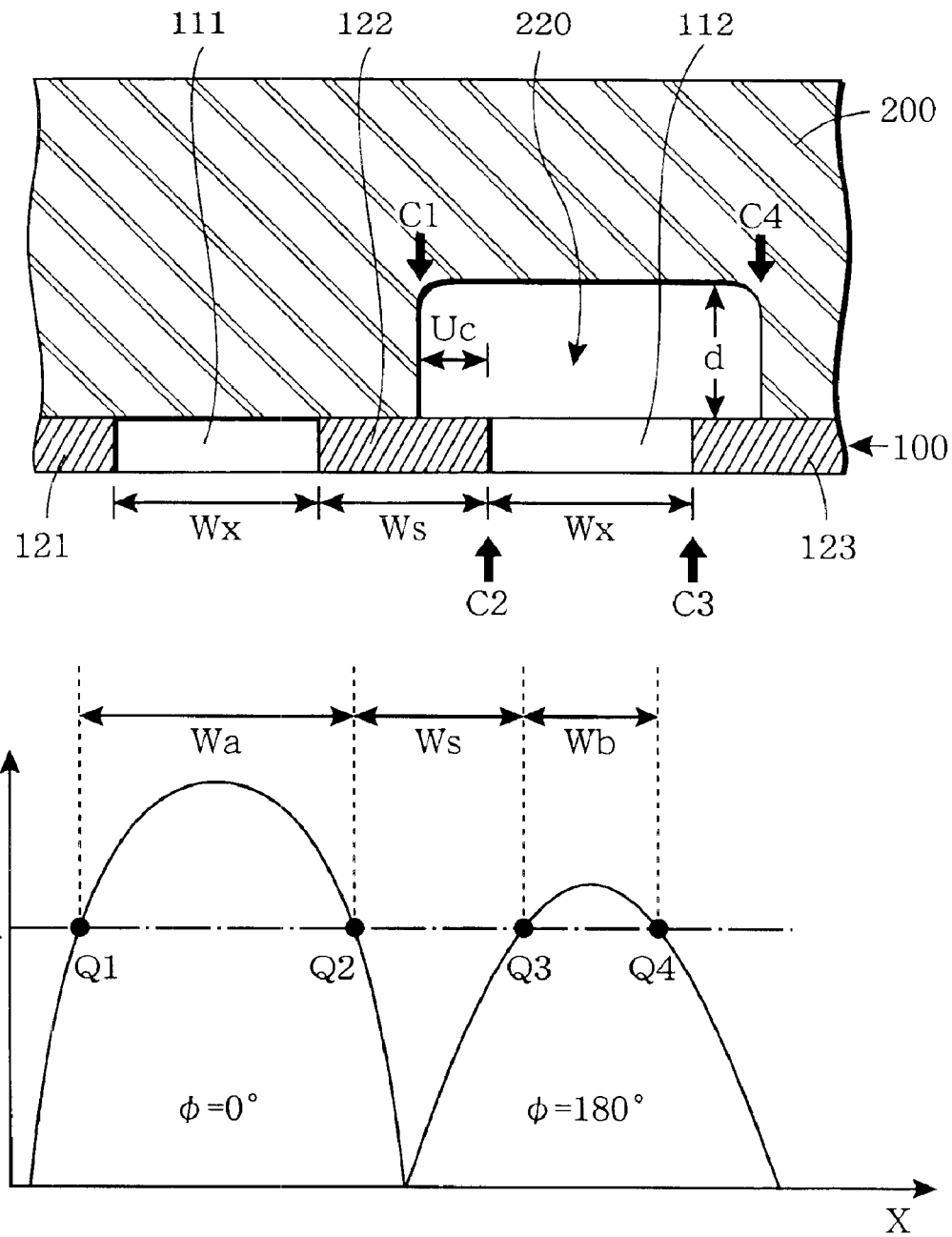
FIG. 8 shows a sectional side view (upper diagram), showing a part of the phase shift mask of the upper diagram of FIG. 7 in a further enlarged manner, and a graph (lower diagram), showing the intensity of the light transmitted through this phase shift mask.

FIG. 8 shows a sectional side view (upper diagram), showing a part of the phase shift mask of the upper diagram of FIG. 7 in a further enlarged manner, and a graph (lower diagram), showing the intensity of the light transmitted through this phase shift mask. As shown in the upper diagram, a trench 220 of a predetermined depth d is formed in a substrate 220 and the outline of this trench 220 is set to be greater than the outline of aperture 112. That is, the position C1 of the outline of the left side (left side face) of trench 220 is retreated slightly to the left of the left-side outline position C2 of aperture 112 (right-end position of opaque part 122) and the position C4 of the outline of the right side (right side face) of trench 220 is retreated slightly to the right of the right-side outline position C3 of aperture 112 (left-end position of opaque part 123).

Here, the distance between the outline position of trench 220 and the outline position of aperture 112 shall be referred to as the undercut amount Uc as shown in the Figure. Put in another way, this undercut amount Uc corresponds to being the width of the eaves portions of opaque parts 122 and 123 that are formed at the opening portions of trench 220. In terms of restraining the influence of interference of the light that leak out from the side faces of trench 220, the greater this undercut amount Uc, the more preferable. Actually, by setting the undercut amount Uc to at least a predetermined value, the influence of interference of the light L4 that leak out from the side faces of trench 220 can be restrained completely as in the example shown in FIG. 7, and the intensities of the light L1, L2, and L3 that are transmitted through the three apertures 111, 112, and 113 will be equal.

However, as the two-dimensional layout pattern that is formed on substrate 200 becomes finer, it becomes more difficult to secure an adequate undercut amount Uc. This is because as the layout pattern is made finer, the width Wx in the X-axis direction of apertures 111 and 112 and the width Ws in the X-axis direction of opaque parts 121, 122, and 123, shown in the upper diagram of FIG. 8, become smaller and thus the areas of contact between opaque parts 121, 122, and 123 and substrate 200 inevitably become smaller. As mentioned above, whereas substrate 200 is normally formed of a layer of transparent material, such as quartz glass, opaque layer 100 is formed of a layer of chromium or other metal material with an opaque property. Opaque layer 100 is thus more readily separated from substrate 200 the less the contact area between the two material layers.

Consequently, in order to manufacture a phase shift mask with adequate integrity for withstanding an actual exposure process to be performed on a semiconductor wafer, a contact area of a certain magnitude or more has to be secured between the two material layers. In other words, unless a contact dimension (Ws−Uc) of a certain magnitude or more is secured between opaque layer 122 and substrate 200 in the upper diagram of FIG. 8, opaque layer 122 may separate from substrate 200. It is thus inevitable that the undercut amount Uc that can actually be secured becomes smaller as the layout pattern becomes finer (as the width Ws of opaque layer 122 becomes smaller).

Actually, with a fine pattern with which the width Ws of opaque layer 122 is a few hundred nm's, it becomes difficult to secure an adequate undercut amount Uc. Obviously, the influence of interference of light leaking out from the side faces of trench 220 then becomes non-negligible and the intensity of light transmitted through trench 220 decreases. The graph of the lower diagram of FIG. 8 shows an example where the intensity of light transmitted through aperture 112 (light with a phase φ=180 degrees) is decreased in comparison to the light transmitted through aperture 111 (light with a phase φ=0 degree) due to the influence of such interference. Though the apertures 111 and 112 formed in opaque layer 100 are rectangular apertures of the same size of width Wx as shown in the upper diagram of FIG. 8, the intensities of the light transmitted through the respective apertures under a predetermined condition will differ as shown in the graph of the lower diagram of FIG. 8.

Here, the difference in the intensities of the light that are transmitted through such a pair of adjacently disposed apertures 111 and 112 shall be defined and handled quantitatively as a light intensity deviation. As long as the difference in the magnitudes of two light intensity distributions, such as those shown in the lower diagram of FIG. 8, can be indicated quantitatively, the light intensity deviation may be defined in any way. For example, the areas of the two graphs may be determined and the ratio or the difference of the areas may be defined as the light intensity deviation. Or, the peak values of the two graphs may be determined and the ratio or the difference of the values may be defined as the light intensity deviation.

Here, as shown in the lower diagram of FIG. 8, a predetermined threshold value Th is set for the light intensity, a level line (the line indicated by the alternate long and short dash line in the Figure) corresponding to this threshold value Th is drawn on the two-dimensional coordinate system, the intersections of this level line with the respective graphs are defined as Q1, Q2, Q3, and Q4, the distance Wa between the two points Q1 and Q2 and the distance Wb between the two points Q3 and Q4 are determined, and the difference, D=Wa−Wb is defined as the light intensity deviation D for the illustrated embodiment. In this case, since the value of light intensity deviation D will vary depending on how the threshold value Th is set, threshold value Th is set to a value such that the distance between the two points Q2 and Q3 will be equal to the width Ws of opaque part 122. In other words, when a graph such as that shown in the lower diagram of FIG. 8 is obtained, a level line that is parallel to the X-axis is defined so that the distance between the two points Q2 and Q3 will be equal to the width Ws of opaque part 122, the distance Wa and Wb are determined based on this level line, and the light intensity difference D is defined as the difference D=Wa−Wb.

By defining the light intensity deviation D by such a method, light intensity deviation D will be determined uniquely for a graph such as that shown in the lower diagram of FIG. 8. Though as mentioned above, the light intensity deviation may be defined in any way in putting this invention into practice as long as it can quantitatively indicate the difference between the transmitted light intensity for phase φ=0 degree and the btransmitted light intensity for phase dφ=180 degrees, the use of the light intensity deviation D defined as the difference D=Wa−Wb as indicated in the present embodiment is extremely practical. This is because, when the light intensity deviation is defined by a method of comparing the areas of the graphs, there is the demerit that the computing load for determining the areas becomes large, and when the light intensity deviation is defined by a method of comparing the peak values of the graphs, there is the demerit that the precision of comparison will be low. The light intensity deviation D that is defined as the difference D=Wa−Wb employs a method of comparing the widths of the graphs at a predetermined level position and is thus low in computing load and also provides the merit of enabling the securing of certain level of precision of comparison. Such a light intensity deviation D that is defined as the difference D=Wa−Wb is, in general, referred to as a "Walking Distance".

Consequently, when due to the layout pattern becoming fine, an adequate undercut amount Uc cannot be secured, a light intensity deviation D will arise for the light transmitted through a pair of adjacent apertures 111 and 112 as shown in the lower diagram of FIG. 8, even with a trench-type, Levenson-type phase shift mask, such as that shown in the upper diagram of FIG. 8.

In order to prevent such a light intensity deviation D from occurring in the exposure of a semiconductor wafer, dimensional corrections considering the occurrence of light intensity deviation D in advance are applied to the two-dimensional layout pattern formed on the phase shift mask. Specifically, in the case of the example illustrated in FIG. 8, corrections must be applied to the sizes of apertures 111 and 112.

For example, with the example shown in FIG. 8, the light intensity deviation D arises as a result of aperture 111, for which the phase of transmitted light is such that φ=0 degree (in other words, the aperture with which a trench is not formed), and aperture 112, for which the phase of transmitted light is such that φ=180 degrees (in other words, the aperture with which a trench is formed), being set to the same width Wx. By performing a correction by which the width Wx of aperture 111 is slightly narrowed and performing a correction by which the width Wx of aperture 112 is slightly widened, the intensity of light transmitted through aperture 111 can be decreased and the intensity of light transmitted through aperture 112 can be increased. The light intensity deviation D can thus be made zero if the correction amounts of the widths can be set appropriately.

However, as a realistic problem, a vast amount of labor and time is required for determining optimal correction amounts for making the light intensity deviation D zero. This is because, as shown in the sectional side view of the upper diagram of FIG. 8, with a trench-type, Levenson-type phase shift mask in which a trench is formed in substrate 200, the part at which trench 220 is formed takes on a three-dimensional structure, making two-dimensional analysis inadequate and necessitating the performing of a three-dimensional analysis. For example, with the illustrated example, though the intensity of light transmitted through aperture 112 will obviously increase if the width Wx of aperture 112 is widened by a small amount, how much the light intensity will increase cannot be known unless a photomask of the exact design dimensions is actually manufactured and experimented with or a three-dimensional simulation using a computer is executed. Thus in designing a single phase shift mask, a vast amount of labor and time will be consumed in determining an optimal correction amount for making the light intensity deviation D zero by trial and error.

An object of this invention is to provide a designing method and device for phase shift mask that will enable such a work load to be lightened and the working time to be shortened. The basic principles of the designing method of this invention shall now be described.

<<<§3. Correction by a Two Dimensional Layout Pattern >>>

The inventor of the present application recognized that in a case of performing three-dimensional analysis to determine the light intensity deviation D for a three-dimensional structure, such as that shown in the upper diagram of FIG. 8, the respective parameters to be described below are involved. Consider a case where a two-dimensional layout pattern such as that shown in FIG. 9 (the same pattern as that shown in FIG. 1) is formed on opaque layer 100 itself. In this example, rectangular apertures 110 of the same size are formed at five locations and frame-shaped opaque parts 120 surround these apertures 110. Here, a setting for performing a phase shift (a setting by which φ=180 degrees) is applied to every other aperture of the respective apertures 110 that are aligned in the X-axis direction, and a trench 220 is formed at the region of each aperture that has been subject to this setting.

If for this two-dimensional layout pattern, a two-dimensional, X-Y coordinate system is defined as illustrated, the width in the X-axis direction and the width in the Y-axis direction of each aperture 110 are defined as Wx and Wy, respectively, and the width in the X-axis direction of each opaque part 120 is defined as Ws, all of these dimension values Wx, Wy, and Ws will be parameters that affect the value of light intensity deviation D. Needless to say, the undercut amount Uc, shown in the upper diagram of FIG. 8, will also be a parameter that affects the value of light intensity deviation D. The inventor of this application considers that, in performing three-dimensional analysis of the behavior of light from an exposure tool for a trench-type, Levenson-type phase shift mask, these four parameters Wx, Wy, Ws, and Uc are the major parameters that determine the value of light intensity deviation D.

As mentioned above, the behavior of light transmitted through a phase shift mask is affected by the design conditions (two-dimensional dimensions of the apertures, opaque parts, etc.), exposure condition (the values of exposure wavelength, numerical aperture, illumination, etc.), and three-dimensional structures, such as the undercut amount, trench depth, etc. However, the exposure condition is a condition determined by the exposure tool used in the process of forming a pattern on a semiconductor wafer and is not a condition that can be set freely in designing a phase shift mask. Also, though the depth d of trench 220 may be a parameter that defines the three-dimensional structure, this depth d must be set to a length that is necessary for shifting the phase of transmitted light by 180 degrees. The depth d is thus an amount that is determined by the wavelength of the light source of the exposure tool used and is thus not a parameter that can be set as suited. Thus if it is premised that a specific exposure tool is used to execute a pattern forming process on a semiconductor wafer, the predetermined exposure condition is already determined, the value of the depth d of the trench is uniquely determined, and consequently, the parameters that are variable in the designing step of a phase shift mask are the parameters, Wx, Wy, and Ws and the undercut amount Uc that correspond to being a designing condition (two-dimensional dimension condition).

As shall be described later, with the present invention, a three-dimensional analysis for grasping the behavior of light transmitted through a phase shift mask is performed by conducting a three-dimensional simulation or a physical exposure experiment, etc. Since these analyses are all premised on executing a pattern forming process onto a semiconductor wafer using a specific exposure tool, a condition that is unique to the specific exposure tool is set in regard to the exposure condition.

The inventor of this application carried out three-dimensional simulations of cases of varying the combinations of the values of the abovementioned four parameters Wx, Wy, Ws, and Uc in various ways for a three-dimensional structure, such as that shown in the upper diagram of FIG. 8 and determined the light intensity deviation D for each case. As mentioned above, with regard to the exposure condition, a condition that is unique to a specific exposure tool was set.

Figure 10:
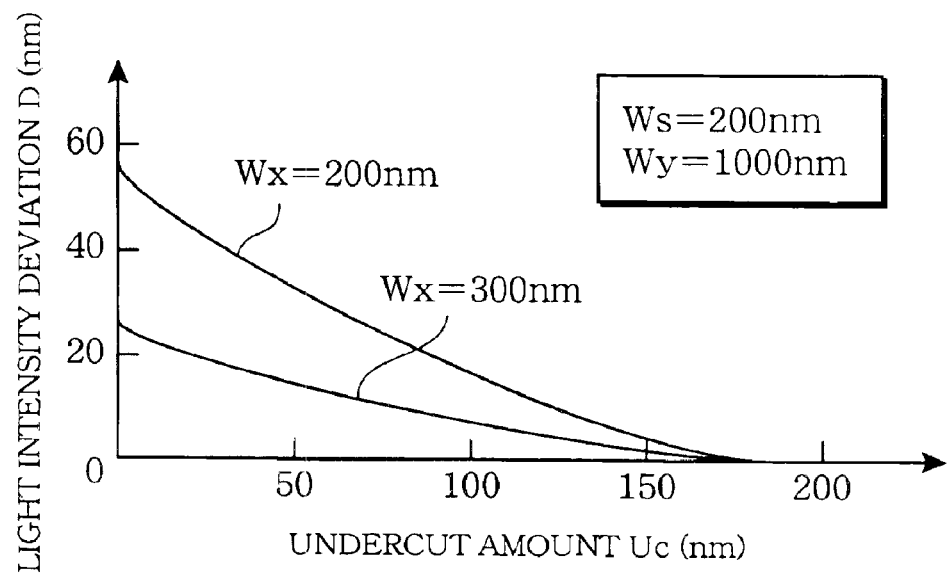
FIG. 10 shows graphs of the relationship between the undercut amount Uc (unit: nm) and the light intensity deviation D (unit: nm) when, in the three-dimensional structure shown in the upper diagram of FIG. 8, the width Ws in the X-axis direction of an opaque part 122 is set equal to 200 nm, the width Wy in the Y-axis direction (in FIG. 8, the width in the direction perpendicular to the paper surface) of each of apertures 111 and 112 is set equal to 1000 nm, and the width Wx in the X-axis direction of each of apertures 111 and 112 is set equal to the two values of 200 nm and 300 nm.

For example, the graphs of FIG. 10 are graphs of the relationship between the undercut amount Uc (unit: nm) and the light intensity deviation D (unit: nm) when, in the three-dimensional structure shown in the upper diagram of FIG. 8, the width Ws in the X-axis direction of an opaque part 122 is set equal to 200 nm, the width Wy in the Y-axis direction (in FIG. 8, the width in the direction perpendicular to the paper surface) of each of apertures 111 and 112 is set equal to 1000 nm, and the width Wx in the X-axis direction of each of apertures 111 and 112 is set equal to the two values of 200 nm and 300 nm. The light intensity deviation D is the greatest when the undercut amount Uc is 0 (corresponding to the structure shown in the upper diagram of FIG. 5), and the light intensity deviation D decreases as the undercut amount Uc is made larger. And when the undercut amount Uc becomes equal to or greater than a predetermined length, the light intensity deviation D becomes zero. In the illustrated example, the light intensity deviation D can be restrained to zero when the undercut amount Uc exceeds 180 nm. It can also be seen that even if the undercut amount Uc is the same, the light intensity deviation D is smaller in the case where the width Wx in the X-axis direction of an aperture is 300 nm than in the case where the width Wx is 200 nm.

Though the graphs of FIG. 10 are graphs with which Ws and Wy are fixed at Ws=200 nm and Wy=1000 nm, if various combinations are made for Ws and Wy, similar graphs will be obtained for the respective combinations. Though needless to say predetermined exposure condition must be set to perform such three-dimensional simulations, in regard to parameters concerning the structure of a phase shift mask, the value of the light intensity deviation D can be determined if the abovementioned four parameters Wx, Wy, Ws, and Uc (and trench depth d) are determined.

With the example illustrated in the graphs of FIG. 10, the light intensity deviation D can be restricted to zero if the undercut amount Uc is set so that Uc=180 nm or more, and ideal light transmission characteristics, such as those shown in FIG. 7, can thereby be obtained. However, as was mentioned already, as the layout pattern becomes finer, the need to restrain the separation of the opaque layer makes it more difficult to secure an adequate undercut amount Uc. This invention proposes a new method for performing layout designing by which the light intensity deviation D is made closer to zero under designing conditions in which such an adequate undercut amount Uc cannot be secured. Put in another way, this invention provides a method of making the light intensity deviation D closer to zero by applying predetermined corrections to a layout pattern with which the undercut amount Uc is within a range of less than 180 nm in the graph shown in FIG. 10.

The correction that is performed here is a two-dimensional correction performed on the two-dimensional layout pattern, and it is premised that no correction whatsoever is applied to depth d of trench 220 of the three-dimensional structure shown in the upper diagram of FIG. 8. Such a premise is actually obvious in consideration of the object of this invention. That is, since depth d of groove 220 is uniquely determined by the light source wavelength of the exposure tool, it cannot be changed arbitrarily for the reason of "making the light intensity deviation D zero". With regard to the undercut amount Uc, the maximum value thereof is determined automatically by the need to satisfy the physical requirement of preventing the separation of the opaque layer. As is clear from the upper diagram of FIG. 8, as the undercut amount Uc becomes greater, the contact dimension of opaque part 122 with respect to substrate 200 becomes smaller and separation becomes more likely to occur. For practical purposes, the maximum value of the undercut amount Uc having some degree of manufacturing tolerance must be set in adequate consideration of the yield of manufacture of a phase shift mask. Thus the undercut amount Uc cannot be set to a large value arbitrarily for the reason of "making the light intensity deviation D zero".

Figure 11:
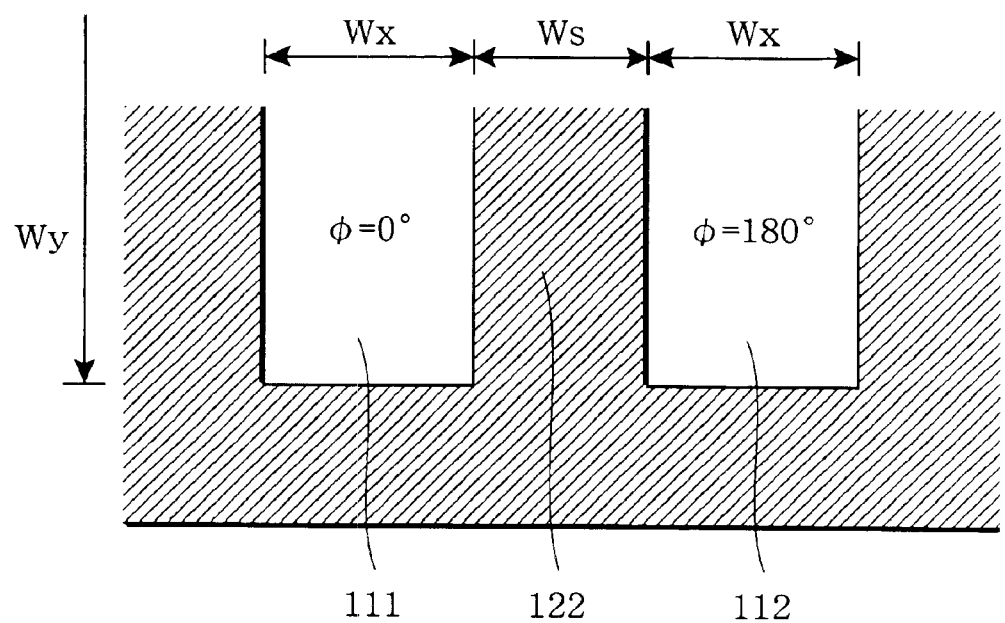
FIG. 11 is a plan view, showing an example of a two-dimensional layout pattern having a pair of apertures 111 and 112 of the same size (the hatching indicates opaque parts and not cross sections).

Suppose now that a designer of a photomask makes a design in which rectangular apertures 111 and 112 of the same size, such as shown in FIG. 11, are disposed on a two-dimensional layout pattern. As mentioned above, since the pair of apertures 111 and 112 are disposed adjacently, if the phase of the light transmitted through one aperture 111 is such that $\phi=0$ degree, measures must be taken to make the phase of the light transmitted through the other aperture 112 such that $\phi=180$ degrees in order to cancel out the influence of light that diffracts into the region of opaque part 122 by the diffraction phenomenon. Specifically, a trench 220 must be formed in the substrate for aperture 112 to set the phase $\phi=180$ degrees as was mentioned above as well.

Here, the pair of apertures 111 and 112 are rectangular open patterns of the same size and are equal in both the width Wx in the X-axis direction and the width Wy in the Y-axis direction. The designer of the photomask positioned such rectangular apertures 111 and 112 of the same size intending to make a photomask that can form rectangular exposure patterns of the same size on the exposed surface of a semiconductor wafer. However, as mentioned above, unless an adequate undercut amount Uc can be secured, the transmitted light intensity of aperture 112 will be lower in comparison to the transmitted light intensity of aperture 111 and it will not be possible to form rectangular exposure patterns of the same size on the exposed surface of a semiconductor wafer as the designer intended.

Figure 12:
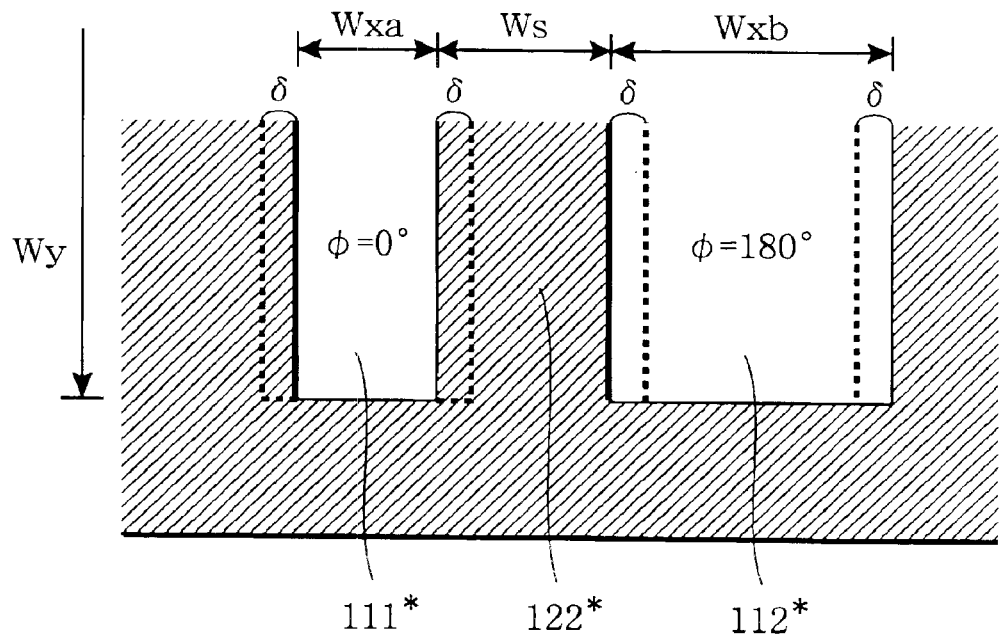
FIG. 12 is a plan view, showing a pattern obtained by applying correction to the two-dimensional layout pattern shown in FIG. 11 (the hatching indicates opaque parts and not cross sections).

Suppose that corrections are thus applied to the two-dimensional layout pattern shown in FIG. 11 and a pattern such as that shown in FIG. 12 is obtained. With this correction, the width Wx in the X-axis direction is changed with each of apertures 111 and 112. That is, aperture 111, for which $\phi=0$ degree, is narrowed in width by just $\delta$ at both the left and right sides and changed to an aperture 111*\ and aperture 112, for which $\phi=180$ degrees, is broadened in width by just $\delta$ at both the left and right sides and changed to an aperture 112*\. Each aperture is not changed in regard to the width Wy in the Y-axis direction. Consequently, the width Wx a in the X-axis direction of aperture 111* after the change is made smaller than the width Wx prior to the change by just 2 δ, and the width Wx b in the X-axis direction of aperture 112* after the change is made larger than the width Wx prior to the change by just 2 δ. As a result, the total amount of light transmitted through aperture 111* decreases and the total amount of light transmitted through aperture 112* increases.

Figure 13:
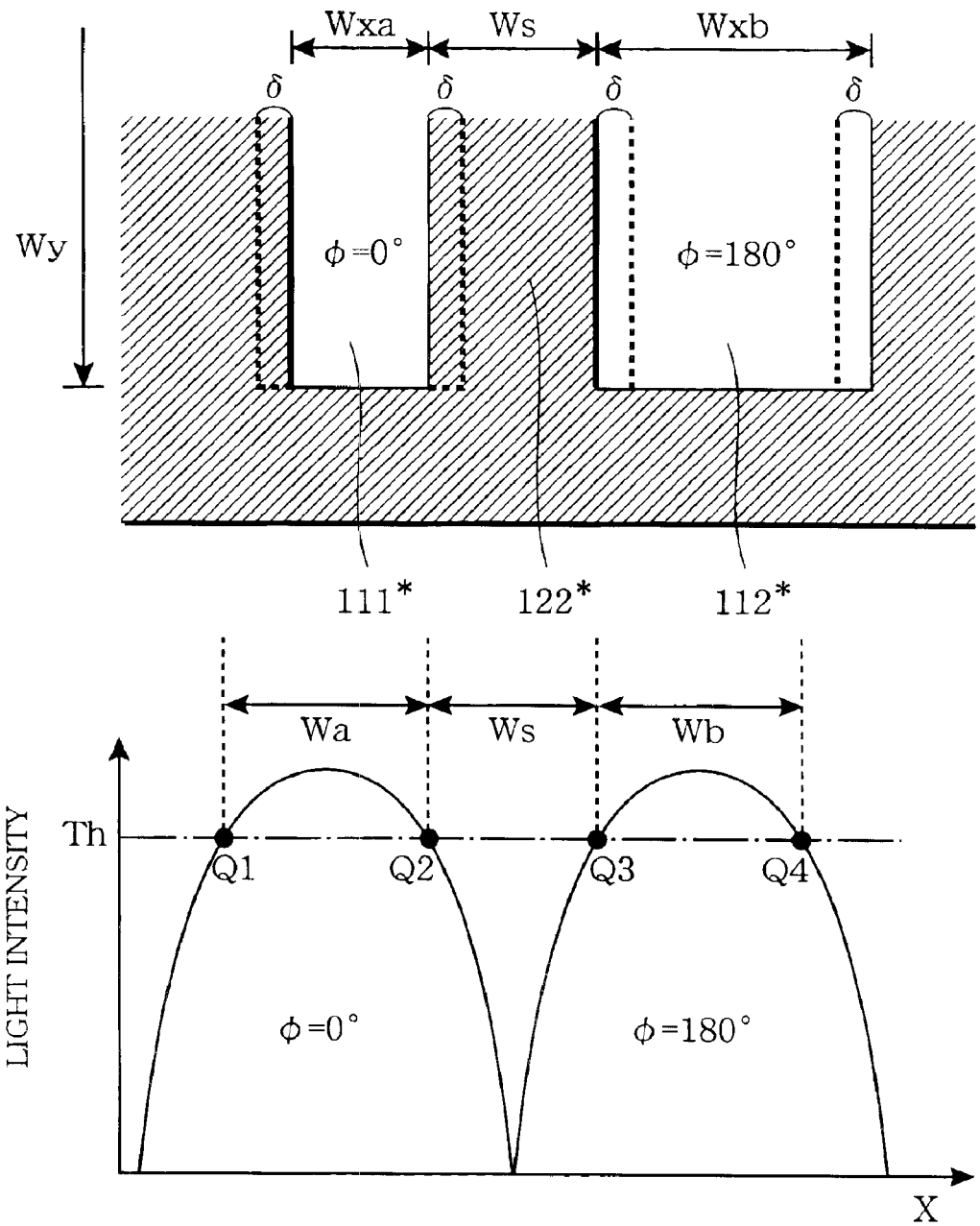
FIG. 13 shows a plan view (upper diagram) of the phase shift mask shown in FIG. 12 and a graph (lower diagram) of the intensity of the light transmitted through this phase shift mask (the hatching indicates opaque parts and semitransparent parts and not cross sections).

Here, as the correction amount δ is increased gradually from 0, the difference in the sizes of the pair of graphs (the graph for φ=0 degree and the graph for φ=180 degrees) shown in the lower diagram of FIG. 8 decreases gradually. Thus by setting the correction amount δ to an appropriate amount, the pair of graphs can be made equal in size as shown in FIG. 13 and rectangular exposure patterns of the same size can be formed on the exposed surface of a semiconductor wafer. This is the basic principle of the correction that is carried out in this invention. Here, the correction amount δ for increasing or decreasing the widths of apertures in such a manner shall be referred to as the "bias correction amount δ".

That is, with this invention, when a two-dimensional layout pattern such as that shown in FIG. 11 is designed by a designer, the corrections of narrowing the width of an aperture with which a phase shift is not performed (an aperture for which φ=0 degree) and widening the width of an aperture with which a phase shift is performed (an aperture for which φ=180 degrees) are made to cancel out the decrease of light intensity that occurs, due to the existence of a trench, at just the aperture with which a phase shift is performed. With the pattern after correction, shown in FIG. 12, though the two apertures 111* and 112* have different widths Wxa and Wxb, when exposure is actually performed using the phase shift mask, rectangular exposure patterns of the same size can be formed on the exposed surface of a semiconductor wafer.

In correcting the widths of the respective apertures, corrections are preferably made so that the center positions of the respective positions will always be fixed. For example, the center positions in the X-axis direction of the apertures 111 and 112 shown in FIG. 11 match the center positions in the X-axis direction of the apertures 111* and 112* shown in FIG. 12. Put in another way, aperture 111* is obtained by applying a correction that narrows the width of aperture 111 uniformly from both sides, and aperture 112* is obtained by applying a correction that widens the width of aperture 112 uniformly at both sides. As a result, the width Ws of opaque part 122* after correction will be matched with the width Ws of opaque part 122 prior to correction (the position will be shifted slightly) and there will thus be no changes in the width of the opaque part.

With regard to the pitch of apertures, whereas a pitch P in the case of the pattern shown in FIG. 11 is such that "P =Wx+Ws", a pitch P* in the case of the pattern after correction that is shown in FIG. 12 will be "P*=Wxa+Ws (in the case of an odd number pitch)" or "P*=Wxb+Ws (in the case of an even number pitch)", and thus an odd number pitch will be narrow and an even number pitch will be wide. However, the sum of an odd number pitch and an even number pitch will not differ before and after the corrections. That is, with regard to the plan view shown in FIG. 9, though some changes will be made in terms of pitch P by the corrections, no changes will be made in terms of pitch 2P by the corrections. The change of the layout pitch of the apertures that results from the above-described correction therefore will not give rise to a major problem in terms of practical use.

<<<§4. Basic Principles of the Designing Method According to the Present Invention >>>

Thus in principle, by correcting the layout pattern shown in FIG. 11 to the layout pattern shown in FIG. 12, a phase shift mask, by which a designer's intended exposure pattern can be obtained, can be realized even if the undercut amount Uc is inadequate. However in actuality, there remains the problem of how to determine an appropriate bias correction amount δ. The reason for this is that, as was mentioned above, with a trench-type, Levenson-type phase shift mask, with which a trench is formed in substrate 200, the part at which trench 220 is formed takes on a three-dimensional structure, thus making two-dimensional analysis inadequate and making three-dimensional analysis necessary. As mentioned above, though this three-dimensional analysis can be executed by a method of determining the four parameters Wx, Wy, Ws, and Uc and determining the value of the light intensity deviation D, a vast amount of labor and time are required to determine, by trial and error, an optimal bias correction amount 6 that makes the light intensity deviation D zero as shown in FIG. 13.

The inventor of this application thus came up with the following idea. First, let the values of the three parameters Wx, Wy, and Ws (widths of aperture prior to correction and width of opaque part; these shall be referred to hereinafter as a "two-dimensional dimension condition") are fixed. In this case, the bias correction amount δ necessary for making the light intensity deviation D zero will differ according to the undercut amount Uc. For example, the graph of Wx=200 nm in FIG. 10 shows the relationship between the undercut amount Uc and the light intensity deviation D when the values of the three parameters Wx, Wy, and Ws (two-dimensional dimension condition) are fixed at 200 nm, 1000 nm, and 200 nm, respectively. As mentioned above, the light intensity deviation D can be held at zero when the undercut amount Uc exceeds 180 nm, and the value of the light intensity deviation D becomes greater the smaller the undercut amount Uc. Thus in order to hold the value of the light intensity deviation Dat zero by correcting the aperture's width Wx upon setting a predetermined bias correction amount δ, the value of the bias correction amount δ must be set larger the smaller the undercut amount Uc.

FIG. 14 is a table of light intensity deviation values D (unit: nm) obtained as a result of performing a three-dimensional simulation, with which the undercut amount Uc and the bias correction amount δ are varied in a plurality of ways with the two-dimensional dimension condition being fixed at Wx=400 nm, Wy=4000 nm, and Ws=400 nm and under predetermined exposure condition. Specifically, the undercut amount Uc is varied at 17 different values at an increment of 10 nm from 0 to 160 nm and the bias correction amount δ is varied at 13 different values at an increment of 5 nm from 0 to 60 nm. In other words, the results shown are those of determining the value of light intensity deviation D by performing three-dimensional simulation on 17×13=221 cases.

For example, the result 7.9 is indicated in the column for undercut amount Uc=40.0 and bias correction amount δ=5.0, and this indicates that when, upon defining a two-dimensional layout pattern, such as that shown in FIG. 11 and having the two-dimensional dimension condition of Wx=400 nm, Wy=4000 nm, and Ws=400 nm, a correction, such as that shown in FIG. 12, is applied by setting the bias correction amount δ=5.0 nm for this two-dimensional layout pattern and a three-dimensional simulation is performed on a three-dimensional structure of aperture 112 for performing phase shifting, such as that shown in the upper diagram of FIG. 8, with the undercut amount Uc being set to 40.0 nm and the depth d of the trench being set to a value that is based on the exposure wavelength of the predetermined exposure condition, the transmitted light intensity of the light transmitted through aperture 112* is found to be less than the light transmitted through aperture 111* and a light intensity deviation D=7.9 nm is obtained.

This result indicates that when the undercut amount Uc is set equal to 40.0 nm, a bias correction amount δ of 5.0 nm is still inadequate. When, as illustrated, the bias correction amount δ is increased in the order of 10.0 nm, 15.0 nm, and 20.0 nm, the light intensity deviation D decreases in the order of 6.2 nm, 3.2 nm, and 0.1 nm. And when the bias correction amount δ is increased to 25.0 nm, the light intensity deviation D takes on a negative value of −3.0 nm. This indicates that, as a result of setting the bias correction amount δ to too large a value, the transmitted light intensity of the light transmitted through aperture 112* became greater than the light transmitted through aperture 111*. The ideal bias correction amount with which the intensity of the light transmitted through aperture 112* becomes equal to the intensity of the light transmitted through aperture 111* as shown in the lower diagram of FIG. 13 can be determined as the value that makes the light intensity deviation D zero, and in a simulation in which the bias correction amount δ is varied discretely in increments of 5 nm as shown in FIG. 14, the bias correction amount δ, by which the absolute value of the light intensity deviation D is minimized, is obtained as the optimal value. Thus in the case of the illustrated example, the optimal value of the bias correction amount δ for an undercut amount Uc=40.0 nm is 20.0 nm with which the light intensity deviation D takes on the minimum value of 0.1.

In the table of FIG. 14, the values surrounded by a frame of thick lines indicate the light intensity deviations D of the minimum absolute value in the respective undercut amount Uc columns. By thus performing three-dimensional simulations for 17×13=221 cases and determining the values of the light intensity deviation D, an optimal value of the bias correction amount δ that minimizes the light intensity deviation D can be obtained for each of the 17 different undercut amounts Uc. In other words, each thick-line frame in this table indicates an optimal combination of the undercut amount Uc and bias correction amount δ. For example, the combinations, "Uc=0.0 and δ=40.0", "Uc=10.0 and δ=35.0", "Uc=20.0 and δ=30.0", and "Uc=30.0 and δ=25.0" are all optimal combinations.

The basic principles of this invention's designing method for phase shift mask are to priorly determine combinations of the undercut amount Uc and the bias correction amount δ that would provide optimal correction results in the above-described manner and to select one combination from among these combinations in the process of designing each phase shift mask to determine the undercut amount Uc and the bias correction amount δ. Since all of the priorly prepared combinations of the undercut amount Uc and the bias correction amount δ are combinations by which optimal correction results can be obtained, good correction results will be obtained when any combination is selected.

Obviously, the results such as those shown in FIG. 14 are results unique to a specific two-dimensional dimension condition (the two-dimensional dimension condition of Wx=400 nm, Wy=4000 nm, and Ws=400 nm in the present example) and the combinations by which the optimal correction results can be obtained will differ if the two-dimensional dimension condition differs. The obtained results will change, for example, even if just the Wx among the two-dimensional dimension condition is changed. Thus for practical use, results, such as those shown in the table of FIG. 14, must be determined for each of several sets of two-dimensional dimension conditions for which the possibility of actual use in the designing of two-dimensional layout patterns is high. For example, if the three types of dimensional conditions of 200 nm, 300 nm, and 400 nm are set for each of Wx and Ws and the four types of dimensional conditions of 500 nm, 1000 nm, 2000 nm, and 4000 nm are set for Wy, there will be 3×3×4=36 combinations, and results such as those shown in the table of FIG. 14 must be obtained for each of these total of 36 different sets of two-dimensional dimension conditions.

Since for practical use, the respective dimension values must be set more finely and results must be determined for an even greater number of sets of two-dimensional dimension conditions, a vast amount of labor and time are required for the preparation step of priorly determining such optimal combinations of the undercut amount Uc and the bias correction amount δ. However, once such combinations are determined, they can be used to determine the undercut amount Uc and the bias correction amount δ readily in each designing step.

Here, a table that indicates the correspondence between specific undercut amounts Uc and specific bias correction amounts δ that are optimal value to the respective specific undercut amounts Uc (for example, the table showing the correspondence between Uc and δ in the cells surrounded by thick-line frames in FIG. 14) shall be referred to as an "optimal function". It is not necessary to define such an optimal function as a table that shows the correspondence between specific Uc values and specific δ values and this correspondence may also be defined in the form of an approximating equation.

Figure 15:
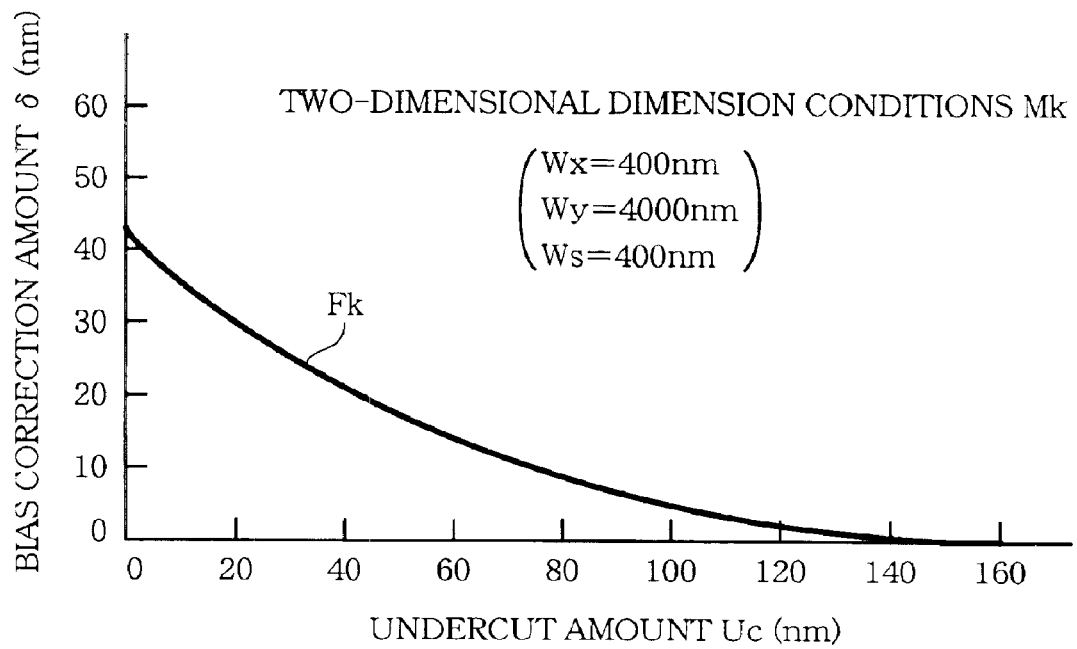
FIG. 15 is a graph, illustrating an optimal function defined as an equation based on the results shown in the table of FIG. 14.

For example, the graph of FIG. 15 is a graph that indicates an optimal function Fk that is defined as an equation based on the results shown in the table of FIG. 14. Here, the suffix k of the optimal function "Fk" indicates the optimal function as being that obtained under the k-th two-dimensional dimension condition Mk (the two-dimensional dimension condition of Wx=400 nm, Wy=400 nm, and Ws=400 nm in the present example). The optimal function Fk shown in FIG. 15 expresses a functional relationship between the undercut amount Uc and the bias correction amount δ such that the value of the light intensity deviation D will be zero in the table shown in FIG. 14, and may be obtained for example by use of a least squares method or other mathematical method. If an optimal function Fk can thus be defined as a function expressed in a certain equation form, the value of the optimal bias correction amount δ corresponding to an arbitrary undercut amount Uc can be determined immediately by a simple mathematical operation.

Though the optimal function Fk shown in FIG. 15 is a function defined for a definition range over the entire range from 0 to 160 nm and a value range over the entire range from 0 to 43 nm, for practical use, the use of this optimal function Fk across the entire ranges is not preferable. This is because, for practical use, upper limits exist respectively for the undercut amount Uc and the bias correction amount δ. First for the undercut amount Uc, an upper limit exists for restraining the separation of the opaque layer as was mentioned above. That is, since opaque layer 122 may separate from substrate 200 unless a certain contact dimension (Ws−Uc) or more is secured between opaque layer 122 and substrate 200 in the upper diagram of FIG. 8, the undercut amount Uc that can actually be secured inevitably becomes smaller the smaller the width Ws of opaque layer 122.

Meanwhile, the upper limit of the bias correction amount δ is determined by a factor that is generally called the MEEF (Mask Error Enhancement Factor). This is because an exposure process using an optical system is performed to transfer a predetermined two-dimensional layout pattern onto a semiconductor wafer using a photomask and the generation of pattern distortion and dimensional errors cannot be avoided, and a bias correction amount δ that is too large will cause the effects of such pattern distortion and dimensional errors to increase.

Thus for practical use, even if an optimal function Fk, such as that shown in FIG. 15, is obtained as a result of the abovementioned three-dimensional simulation, it is preferable to set predetermined upper limits respectively for the undercut amount Uc and the bias correction amount δ and to set an optimal function Fk such that the definition range and the value range will be less than or equal to the respective upper limits. For example, with the example shown in FIG. 16, the upper limit Ucmax of the undercut amount Uc is set equal to 90 nm, the upper limit δmax of the bias correction amount δ is set equal to 35 nm, and the definition of the optimal function Fk is avoided at regions in which the upper limits are exceeded (regions indicated by hatching in the Figure). The actual optimal function Fk is thus defined just in the portion indicated by the solid line in the Figure and is not defined in the portions indicated by the broken lines. Needless to say, since the upper limit Ucmax of the undercut amount and the upper limit δmax of the bias correction amount differ according to the two-dimensional dimension conditions, these upper limits are set separately and independently for each optimal function Fk.

Figure 16:
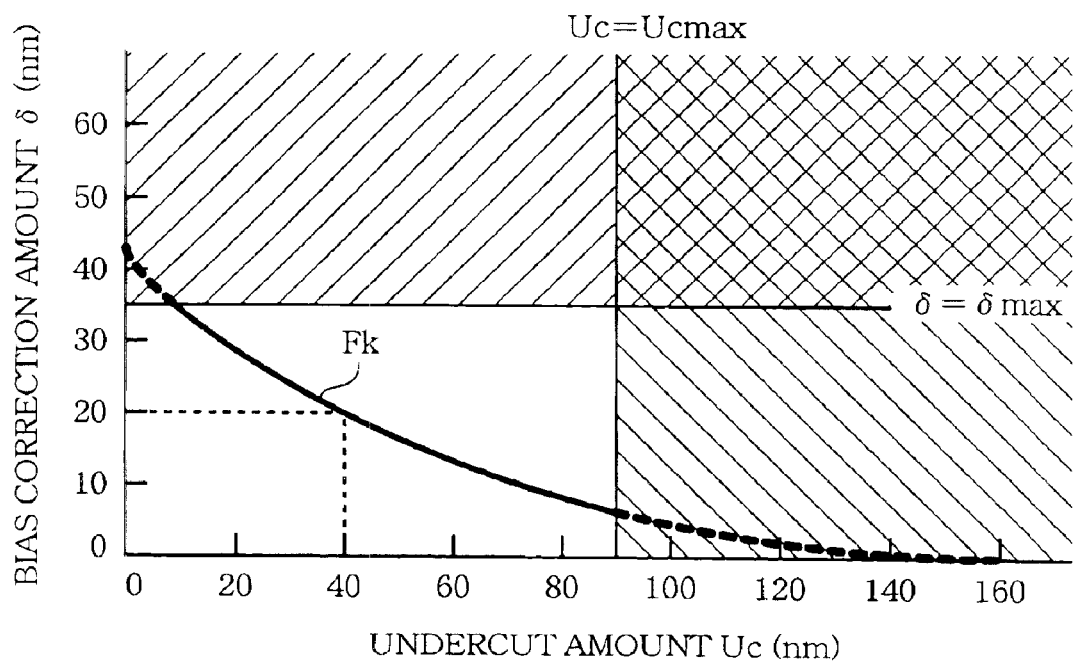
FIG. 16 is a graph, illustrating an example where the upper limit Ucmax of the undercut amount Uc is set equal to 90 nm and the upper limit δmax of the bias correction amount δ is set equal to 35 nm in the optimal function Fk shown in FIG. 15.

This invention's designing method for phase shift mask comprises a preparation step, in which such an optimal function is defined for each of a plurality of two-dimensional dimension conditions, and a designing step, in which an actual phase shift mask is designed using the optimal function that was defined in the preparation step. At the point of completion of the preparation step, optimal functions Fk, such as that indicated by the solid line in FIG. 16, are defined for each of the various sets of two-dimensional dimension conditions.

The procedures of the designing step of this invention shall now be described. Normally, the designing of a phase shift mask is started with the designing of a two-dimensional layout pattern. Here, suppose a two-dimensional layout pattern such as that shown in FIG. 9 has been designed. The dimensions of the respective parts are also determined in designing of such a two-dimensional layout pattern. Here suppose that the dimension values in FIG. 9 are set as Wx=400 nm, Wy=4000 nm, and Ws=400 nm and that phase shifting is not to be performed (φ=0 degree) with an aperture of an odd number while phase shifting is to be performed (φ=180 degrees) with an aperture of an even number.

Figure 9:
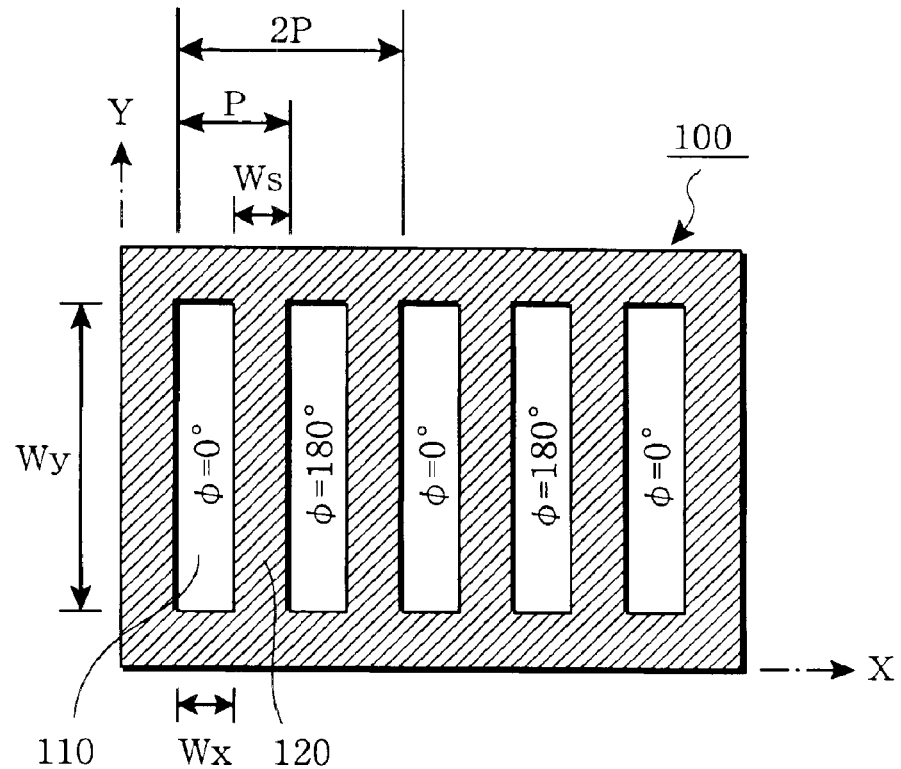
FIG. 9 is a plan view, showing the dimensions of the respective parts of the two-dimensional layout pattern shown in FIG. 1 (the hatching indicates opaque parts and not cross sections).

Needless to say, a designer designing a two-dimensional layout pattern such as that shown in FIG. 9 intends to prepare a phase shift mask by which the two-dimensional layout pattern can be transferred as illustrated onto a semiconductor wafer. However in actuality, unless an adequate undercut amount Uc can be secured, a pattern cannot be transferred as intended with a phase shift mask in which a two-dimensional layout pattern is formed with the exact dimensions illustrated. Correction by a predetermined bias correction amount δ must thus be applied to this dimensional layout pattern, and by this invention, the optimal value of the bias correction amount δ can be determined along with the undercut amount Uc.

That is, once a designer has designed a two-dimensional layout pattern, such as that shown in FIG. 9, the designer selects a two-dimensional dimension condition that can be applied to this layout pattern. In the case of the layout pattern shown here, since the dimensions of the respective parts are as has been mentioned above, the k-th two-dimensional dimension condition Mk, shown in FIG. 15, is selected. The optimal function Fk that is priorly defined for this k-th two-dimensional dimension condition Mk is then referenced. For practical use, since function portions that exceed upper limit values are not used as mentioned above, the optimal function Fk, indicated by the solid line in FIG. 16, is referenced in place of the optimal function Fk shown in FIG. 15.

The designer then references the optimal function Fk of FIG. 16 to determine a suitable undercut amount Uc within the range in which the function is defined and then the optimal value of bias correction amount δ that corresponds to this undercut amount Uc is determined. For example, if the undercut amount Uc is set equal to 40 nm, the optimal bias correction amount will be determined as δ=20. Or oppositely, an arbitrary bias correction amount δ within the range in which the function is defined may be determined and the optimal value of the undercut amount Uc that corresponds to this bias correction amount δ maybe determined. To summarize, by using this optimal function Fk and suitably determining one of either the undercut amount Uc or the bias correction amount δ, the other amount can be determined automatically and the combination of the undercut amount Uc and the bias correction amount δ that has thus been determined will always be an optimal combination.

For practical use, the respective ends of the graph of the optimal function Fk are preferably avoided and a value near the center is selected as much as possible in determining a suitable value for one of the amounts. This is because the regions near the respective ends of the graph of the optimal function Fk are regions close to the upper limit value of the undercut amount Uc or the bias correction amount δ. By selecting a portion near the center of the graph of optimal function Fk as in the illustrated example, the undercut amount Uc and the bias correction amount δ will be respectively set to the preferable values of 40 nm and 20 nm that are separated from the corresponding upper limit values.

Once the optimal value of the undercut amount Uc and the optimal value of the bias correction amount δ have been determined in this manner, the three-dimensional structure of the trench part of the aperture for performing phase shifting is defined and the correction of the two-dimensional layout pattern is performed based on the optimal values. For example, if as optimal values, the undercut amount Uc is set to 40 nm and the bias correction amount δ is set to 20 nm, the three-dimensional structure of a trench part with which the undercut amount Uc=40 nm is obtained and the dimensional correction using the bias correction amount δ=20 nm is performed on the two-dimensional layout pattern shown in FIG. 9 to provided a corrected two-dimensional layout pattern. Then by preparing a physical phase shift mask based on the corrected two-dimensional layout pattern and three-dimensional structure thus obtained and performing exposure using this phase shift mask, the two-dimensional layout pattern that is in exact accordance to the initial design shown in FIG. 9 will be transferred onto a semiconductor wafer.

As described above, in the case of a simple pattern, with which the two-dimensional layout pattern that is to be designed conforms to a single set of two-dimensional dimension condition as in the example shown in FIG. 9, the undercut amount Uc and the bias correction amount δ can be determined with a relatively high degree of freedom in reference to a single optimal function Fk, such as that illustrated in FIG. 16. However in actuality, a two-dimensional layout pattern that is to be formed on a phase shift mask will generally not be a simple pattern such as that shown in FIG. 9 but will be a more complex pattern. In this case, since a plurality of different sets of two-dimensional dimension conditions will be set on the two-dimensional layout pattern, a plurality of optimal functions to be referenced will be necessary.

For example, consider the case of designing a two-dimensional layout pattern containing a region, in which a plurality of apertures are disposed in accordance with a p-th set of two-dimensional dimension condition Mp such that Wx=100 nm, Wy=500 nm, and Ws=100 nm, and a region, in which a plurality of apertures are disposed in accordance with a s-th set of two-dimensional dimension condition Ms such that Wx=200 nm, Wy=1000 nm, and Ws=200 nm. Here, suppose that the pattern region that is in accordance with dimension condition Mp is wider than the pattern region in accordance with dimension condition Ms, and let the dimension condition Mp be referred to as the "primary dimension condition" and the dimension condition Ms be referred as the "secondary dimension condition". In this case, there may be cases where a major problem will not occur even if the secondary dimension condition Ms is ignored and just the primary dimension condition Mp is considered and the optimal value of the undercut amount Uc and the optimal value of the bias correction amount δ are determined by referencing just the optimal function Fp concerning the primary dimension condition Mp. This is because normally in many cases, some degree of tolerance is incorporated in a two-dimensional layout pattern to be transferred onto a semiconductor wafer and problems of practical use will not arise even if some dimensional errors occur in the regions in which the secondary dimension condition Ms is applied in the above-described case.

Figure 17:
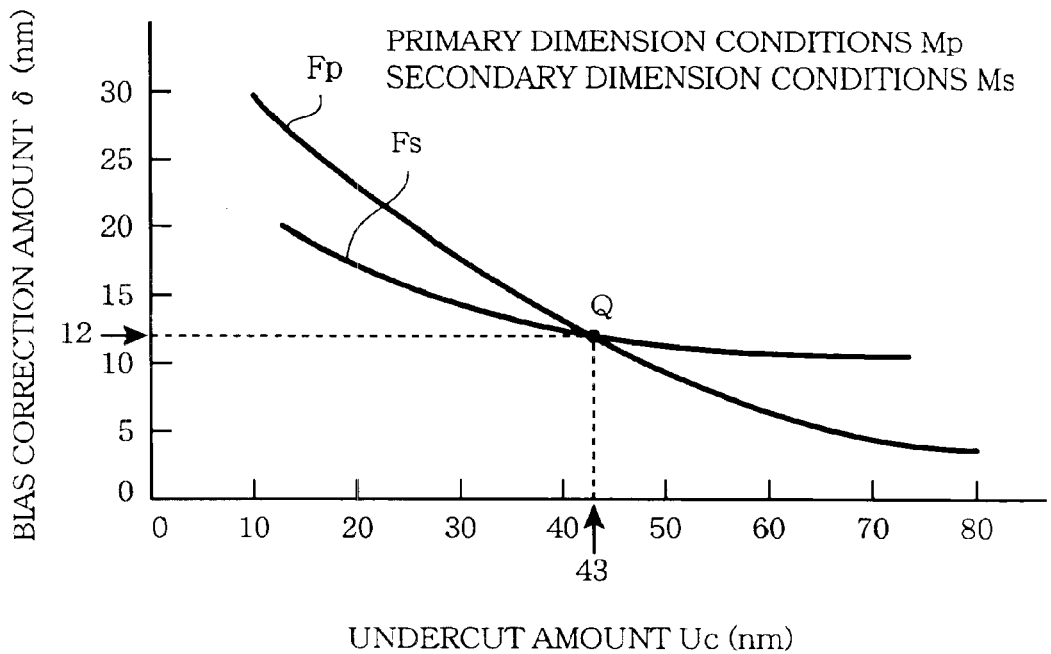
FIG. 17 is a graph, illustrating an example of a method of determining the optimal values of the undercut amount Uc and the bias correction amount δ in a case where two optimal functions Fp and Fs intersect.

However, it is preferable, in terms of making high dimensional precision of the two-dimensional layout pattern to be transferred onto a semiconductor wafer, to take into consideration both sets of dimension conditions and to determine optimal values of the undercut amount Uc and the bias correction amount δ that will be in conformance to both sets of dimension conditions. In such a case, both the optimal function Fp concerning the primary dimension condition Mp and the optimal function Fs concerning the secondary dimension condition Ms are referenced to determine the optimal values of the undercut amount Uc and the bias correction amount δ. FIG. 17 shows graphs with which the undercut amount Uc is set as the abscissa and the bias correction amount δ is set as the ordinate to illustrate an example of such a determination method. With the illustrated example, the graphs of the two optimal functions Fp and Fs intersect at intersection Q. In such a case where two graphs intersect, the intersection Q is determined as the optimal point, the optimal value of the undercut amount Uc is set to the abscissa value of this optimal point Q and the optimal value of the bias correction amount δ is set to the ordinate value of the optimal point Q. With the illustrated example, the optimal value of undercut amount Uc is 43 nm and the optimal value of the bias correction amount δ is 12 nm. Since the optimal point Q is a point that lies along both of the two graphs Fp and Fs, the combination, "Uc=43 nm and δ=12 nm", is a combination conforming to both of the two sets of dimension conditions Mp and Ms. Thus by using a phase shift mask designed based on the values, "Uc=43 nm and δ=12 nm", to perform exposure and transfer of the two-dimensional layout pattern, a transfer result, which is high in dimensional precision in regard to both the pattern region in accordance with dimension condition Mp and the pattern region in accordance with dimension condition Ms, can be obtained.

The graphs of two optimal functions Fp, Fs to be referenced may not always have an intersection. For example, with the example shown in FIG. 18, the graphs of two optimal functions Fp, Fs do not have an intersection. Here, the right end of the graph of optimal function Fs concerning the secondary dimension condition Ms is interrupted at the position of undercut amount Uc=50 nm since the upper limit value of the undercut amount Uc is set to 50 nm as described above.

In such a case where the two graphs do not have an intersection, first for the undercut amount Uc, the coordinate value of the abscissa position at which the two graphs approach each other most is determined as the optimal value. Specifically, the abscissa position, with which a point on graph Fp and a point on graph Fs approach each other most at the same abscissa position, is determined and the undercut amount Uc corresponding to the coordinate value of this abscissa position is set as the optimal value. In the case of the illustrated example, the abscissa position of a coordinate value of 50 nm is such an abscissa position, and at this abscissa position, the point Qp on graph Fp and the point Qs on the graph Fs approach each other the most.

Next, for the bias correction amount δ, the average value, of the ordinate values of the intersections of the respective graphs and a vertical line V drawn at the abovementioned abscissa position, is set as the optimal value. In the case of the illustrated example, since the intersections of the respective graphs and the vertical line V are the points Qp and Qs, respectively, the optimal value of the bias correction amount δ is determined as the average value of the ordinate value of these intersections. Specifically, since the ordinate value of point Qp is 10 nm and the ordinate value of point Qs is 6 nm, the optimal value of the bias correction amount δ is the average value of 8 nm. This is the ordinate value of the midpoint Qps on the vertical line V between points Qp and Qs.

Figure 18:
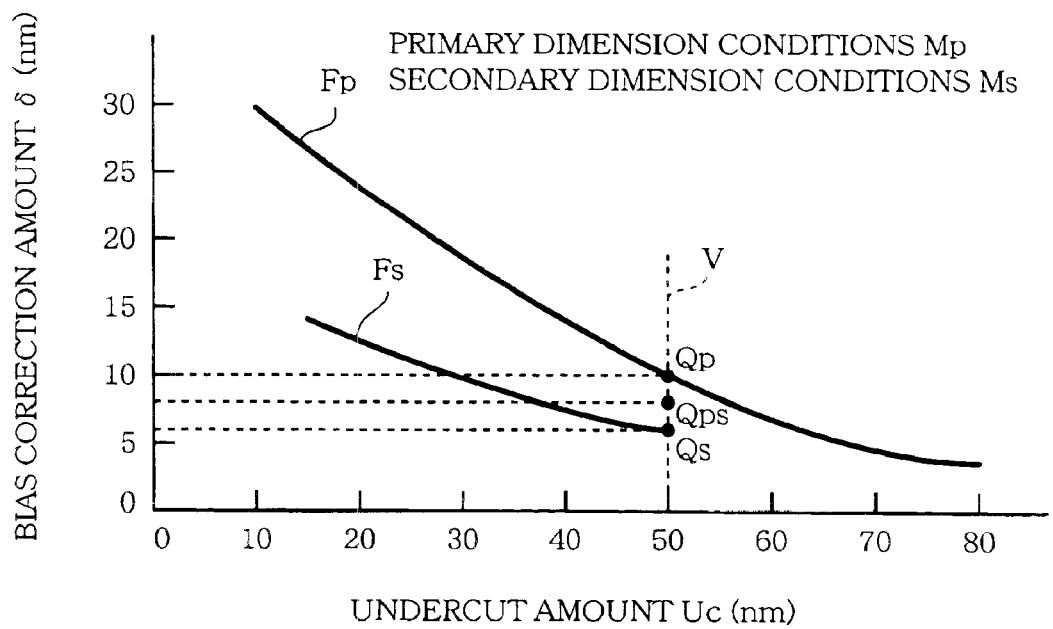
FIG. 18 is a graph, illustrating an example of a method of determining the optimal values of the undercut amount Uc and the bias correction amount δ in a case where two optimal functions Fp and Fs do not intersect.

The process of determining the optimal values of the undercut amount Uc and the bias correction amount δ by the method illustrated in FIG. 18 is thus based on the concept of first determining an abscissa position (50 nm) at which the distance in the ordinate axis direction of the two graphs will be the smallest, determining the coordinate value of this position as the optimal value of the undercut amount Uc and determining the average value of the ordinate values of the points on the respective graphs Fp and Fs corresponding to this optimal value (50 nm) of the undercut amount Uc as the optimal value of the bias correction amount δ. Though obviously when an intersection is obtained as shown in FIG. 17, ideal optimal values are determined for both the undercut amount Uc and the bias correction amount δ, even in cases where an intersection does not exist, as in the case illustrated in FIG. 18, optimal values that are as ideal as possible can be obtained in accordance with the above-described concept.

Though with the above-described example, graphs Fp and Fs were handled equivalently and the optimal value of the bias correction amount δ was determined as the ordinate value of the midpoint Qps of the points Qp and Qs, priorities may be set for the two graphs and the optimal value of the bias correction amount δ may be determined based on these priorities. For example, if in the designed two-dimensional layout pattern, the pattern region in accordance with the primary dimension condition Mp is wider than the pattern region in accordance with the secondary dimension condition Ms, it is preferable to handle the primary dimension condition Mp with more priority. In such a case, the priority of the primary dimension condition Mp is set higher than the priority of the secondary dimension condition Ms in accordance with the area ratio of the two pattern regions and the same priorities are set for the optimal function graphs Fp and Fs as well. By then determining the optimal value of the bias correction amount δ as an average value in which the priorities concerning the respective optimal function graphs are taken into consideration, optimal value determination that is more suited to practical use is enabled.

Though with the example shown in FIG. 18, point Qps is set at the midpoint position of the points Qp and Qs, if a priority setting such as that described above is performed, point Qps will be set at a position that is closer to the point Qp of higher priority, and the average value that takes the priorities into consideration (the average value that is weighted in accordance with the priorities) will take on a value, such as 9nm, which is closer to the ordinate value of point Qp. In this case, though the inherently ideal bias correction amount δ for the pattern region that is in accordance with the secondary dimension condition Ms is 6 nm and a dimensional error occurs in the transfer process because a bias correction amount δ of 9 nm is actually set, since, for the pattern region in accordance with the primary dimension condition Mp that are higher in priority (wider in the region area), a bias correction amount δ of 9 nm that is close to the inherently ideal bias correction amount δ of 10 nm is set, a preferable correction that is more in accordance with the actual circumstances is enabled.

Though for the convenience of description, an example wherein the two sets of two-dimensional dimension conditions of the primary dimension condition Mp and the secondary dimension condition Ms are set on a two-dimensional layout pattern was described here, a larger number of sets of dimension conditions is generally set on an actual layout pattern. The method of determining the optimal values of the undercut amount Uc and the bias correction amount δ based on the abovedescribed concept may also be applied in the same manner to cases where three or more sets of two-dimensional dimension conditions are set.

For example, suppose that ten types of regions that differ mutually in dimension conditions exist on an actual two-dimensional layout pattern and a total of ten types of dimension conditions coexist. In such a case, for practical purposes, a number of sets of dimension conditions of high priority may be selected. If for example five sets of dimension conditions are selected here, the optimal values of the undercut amount Uc and the bias correction amount δ are determined based on the graphs F1 to F5 of the corresponding five optimal functions. First for the undercut amount Uc, the coordinate value of the abscissa position at which the five graphs approach each other the most may be set as the optimal value. Put in another way, a vertical line V, such as that of FIG. 18, is defined, and while moving this vertical line V to the left and right along the abscissa, the intersections (total of five) with the respective graphs are determined, and the abscissa position at which the five intersections approach each other the most (for example, the position at which the sum of the mutual distances of the five intersections becomes the minimum) is determined as the optimal value of the undercut amount Uc. Then after the optimal value of the undercut amount Uc has been determined in this manner, the average value of the ordinate values of the intersections of the respective graphs with the vertical line V drawn at the abovementioned abscissa position (the average value that takes the priorities into consideration if necessary) is determined as the optimal value of the bias correction amount δ. By such a method, the optimal values of the undercut amount Uc and the bias correction amount δ can be determined even if a plurality of optimal functions are extracted.

A case where two graphs have an intersection Q as shown in FIG. 17 may basically be regarded as a special form of the determination process based on the above-described concept. That is, in the case of the example shown in FIG. 17, the abscissa position of "43 nm" is the abscissa position at which the two graphs approach each other the most (that is, the position at which the two graphs intersect), and thus consequently, the coordinate value of the abscissa position at which the two graphs approach each other the most is determined as the undercut amount Uc. Also with the example shown in FIG. 17, the average value of "12 nm" of the ordinate values of the intersections (which are both point Q) of the respective graphs with the vertical line that is drawn at the abscissa position of "43 nm" is set as the optimal value of the bias correction amount δ.

In designing a single phase shift mask, the undercut amount Uc and the bias correction amount δ do not have to be set necessarily to a single value, respectively and a plurality of undercut amounts Uc and a plurality of bias correction amounts δ maybe set. However, for practical use, the undercut amount Uc and the bias correction amount δ are preferably determined as single values when designing a single phase shift mask. Especially in regard to the undercut amount Uc, it is unrealistic to set a plurality of values for a single phase shift mask. This is because in an actual phase shift mask manufacturing process, the forming of a trench is performed by etching and the undercut amount Uc is a quantity that is uniformly determined by the etching conditions. For example, if the undercut amount Uc is determined by design to be 40 nm, the trench forming process is carried out with the etching time, etc., being controlled appropriately so that the actual undercut amount Uc will be 40 nm as designed. Such control of the etching time is performed uniformly for the entire substrate and it is practically impossible to differ the undercut amount Uc according to each aperture. Thus for practical purposes, it is essential that a single common value be set for the undercut amount Uc for a single phase shift mask.

Meanwhile, with regard to the bias correction amount δ, it is not essential that it be set to a single common value for a single phase shift mask. Obviously, it is preferable in terms of the load of correction computation that a single bias correction amount δ be set for a single phase shift mask. The correction computation load will clearly become heavier if a different bias correction amount δ is set for each aperture. However, if a single bias correction amount δ is set forcibly, it may not be possible to perform optimal correction according to each aperture and dimensional errors beyond the tolerable range may arise in the two-dimensional layout pattern that is transferred onto a semiconductor wafer. In such a case, the setting of a different bias correction amount δ according to each individual region cannot be avoided. An optimal value determination method for such a case of setting a plurality of different bias correction amounts δ shall now be described.

With the above-described example illustrated in FIG. 18, the optimal value of the undercut amount Uc and the optimal value of the bias correction amount δ were respectively determined as single values, that is, as the abscissa value (50 nm) and the ordinate value (8 nm), respectively, of the midpoint Qps. However, these values are not necessarily ideal values. This is because, if the optimal value of the undercut amount Uc is set to 50 nm, the ideal optimal value of the bias correction amount δ will be 10 nm, which is the ordinate value of the point Qp, under the primary dimension condition Mp and will be 6 nm, which is the ordinate value of the point Qs, under the secondary dimension condition Ms. However, with this example, even if the optimal value of the bias correction amount δ is set to the average value of 8 nm, since the error under the respective sets of conditions will be ±2 nm, there will not be a major problem in terms of practical use. However, if this error becomes greater, dimensional errors beyond the tolerable range may occur in the two-dimensional layout pattern that is transferred onto a semiconductor substrate. In particular, the validity of the bias correction amount δ determined as an average value becomes more questionable as the number of graphs to be referenced increases.

In such a case where the setting of a single common value as the optimal value of the bias correction amount δ is not preferable, the ordinate value of the point on each individual graph is set as the unique optimal value of the bias correction amount δ under the corresponding set of dimension conditions. For example, with the example of FIG. 18, instead of using the ordinate value of the intermediate point Qps as the single optimal value of the bias correction amount δ, the ordinate value of 10 nm of the point Qp is set as the unique optimal value for the primary dimension condition Mp and the ordinate value of 6 nm of the point Qs is set as the unique optimal value for the secondary dimension condition Ms. Thus in this case, though the optimal value of the undercut amount Uc is set to the single common value of 50 nm, the optimal value of the bias correction amount δ is set individually to 10 nm or 6 nm according to the dimension conditions. Thus the correction concerning the dimension of an aperture is performed based on the bias correction amount δ of 10 nm in the region in which the primary dimension condition Mp is applied and based on the bias correction amount δ of 6 nm in the region in which the secondary dimension condition Ms is applied. Though as mentioned above, the computation load will be considerably heavier when correction computation is performed using a plurality of bias correction amounts δ properly, use of a phase shift mask designed by such a method enables the transfer of a layout pattern to be performed with less dimensional errors.

If unique values according to the respective sets of dimension conditions are to be set as optimal values of the bias correction amount δ, it is not necessary to use the standard of the abscissa position at which a plurality of graphs approach each other the most for determining the optimal value of the undercut amount Uc. For example, with the example illustrated in FIG. 18, though the optimal value of the undercut amount Uc is set to 50 nm, this is done based on the consideration that the distance between the point Qp and the point Qs is the minimum at this point and it thus becomes possible to hold down the errors to the minimum even if the ordinate value of the midpoint Qps is used as the optimal value of the bias correction amount δ. However, if in accordance with the above-described method, the ordinate value of the point Qp and the ordinate value of the point Qs are to be set respectively as separate optimal values of the bias correction amount δ, there will be no problem even if point Qp and point Qs are separated from each other. For example, with the example illustrated in FIG. 18, if the optimal value of the undercut amount Uc is set to 30 nm, the vertical line V is moved in parallel to the position of 30 nm on the abscissa, and the ordinate values of the intersections of the moved vertical line V with the respective graphs Fp and Fs are set as the optimal values of the bias correction amount δ for the dimension conditions Mp and Ms, respectively, a good phase shift mask can be designed even though the computation load of the correction computation will be heavy.

In such a case where an approach of setting a plurality of optimal values of the bias correction amount δ is taken, the degree of freedom of determining the optimal value of the undercut amount Uc increases significantly. For example, with the example illustrated in FIG. 18, the optimal value of the undercut amount Uc is not limited to 50 nm and may be set as suited as long as it is within the range of 15 to 50 nm, which is the defined range in common of the two optimal functions Fp and Fs. As mentioned above, since upper limits exist for the undercut amount Uc and the bias correction amount δ, it is preferable, from the standpoint of avoiding the setting of values close to these upper limits as optimal values, to avoid the vicinities of the respective ends of the graphs. From this standpoint, in the case of the example illustrated in FIG. 18, it is preferable to set the optimal value of the undercut amount Uc to a value near 30 nm, which corresponds to the vicinity of the center of the graph Fs.

The above-described approach of setting a plurality of optimal values of the bias correction amount δ may obviously be applied to cases where three or more graphs are extracted as subjects of reference. For example, in a case where five graphs are defined, the designer performs a process of determining a suitable abscissa position as the optimal value of the undercut amount Uc in consideration of the definition ranges, etc., of the five graphs. Once the optimal value of the undercut amount Uc has been determined thus, a unique optimal value of the bias correction amount δ can be determined according to each set of two-dimensional dimension condition based on the ordinate value of the intersection of the vertical line that is drawn at the position of the optimal value of the undercut amount Uc and a corresponding graph. When five graphs are used, though a single optimal value is determined in common in regard to the undercut amount Uc, a total of five optimal values are determined in regard to the bias correction amount δ. Also, a part of the five optimal values may be consolidated into a single representative optimal value. For example, if two of the five optimal values are close to each other, the average value of these two values may be employed as a representative optimal value and the optimal values may thus be rearranged as a total of four optimal values.

Though with the correction of the two-dimensional layout pattern that has been described up until now, the dimension Wx of the aperture with which phase shifting is not to be performed is reduced by just the bias correction amount δ at the left and right sides respectively and the dimension Wx of the aperture with which phase shifting is to be performed is increased by just the bias correction amount δ at the left and right sides respectively as shown in FIG. 12, the correction amount for reducing a dimension and the correction amount for increasing a dimension do not necessarily have to be set to the same value. That is, a first correction amount δ1, which indicates the amount of increase of a dimension of an aperture with which phase shifting is to be performed, and a second correction amount δ2, which indicates the amount of increase of a dimension of an aperture with which phase shifting is not to be performed, may be set separately. The examples that have been described up until now are thus modes in which the first correction amount δ1 and the second correction amount δ2 are set to an equal value.

In a case where the first correction amount δ1 and the second correction amount δ2 are set as separate and independent values, the optimal function is a function that expresses the relationship among the three parameters of the undercut amount Uc, the first correction amount δ1, and the second, correction amount δ2 and expresses combinations of these three parameters that can make the light intensity deviation D zero. In this case, graphs of the optimal functions form curved surfaces in three-dimensional space and a process of determining the respective optimal values of the undercut amount Uc, the first correction amount δ1, and the second correction amount δ2 is performed based on these optimal functions that are expressed as curved surfaces.

<<<§5. Specific Procedures of the Designing Method for Phase Shift Mask According to the Present Invention >>>

Figure 19:
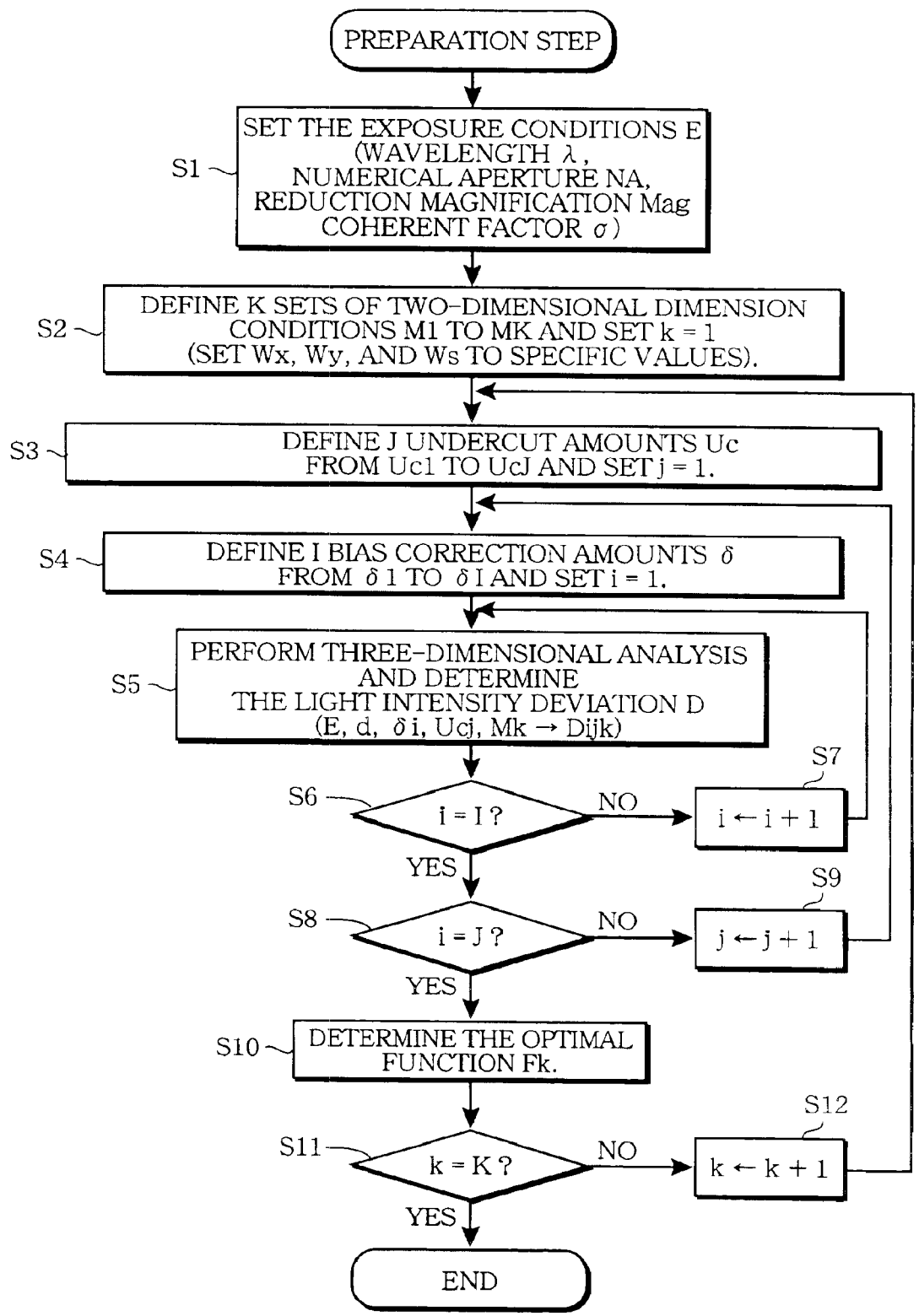
FIG. 19 is a flowchart, showing the procedures of a preparation step, corresponding to the first half of a phase shift mask designing method by this invention.
Figure 20:
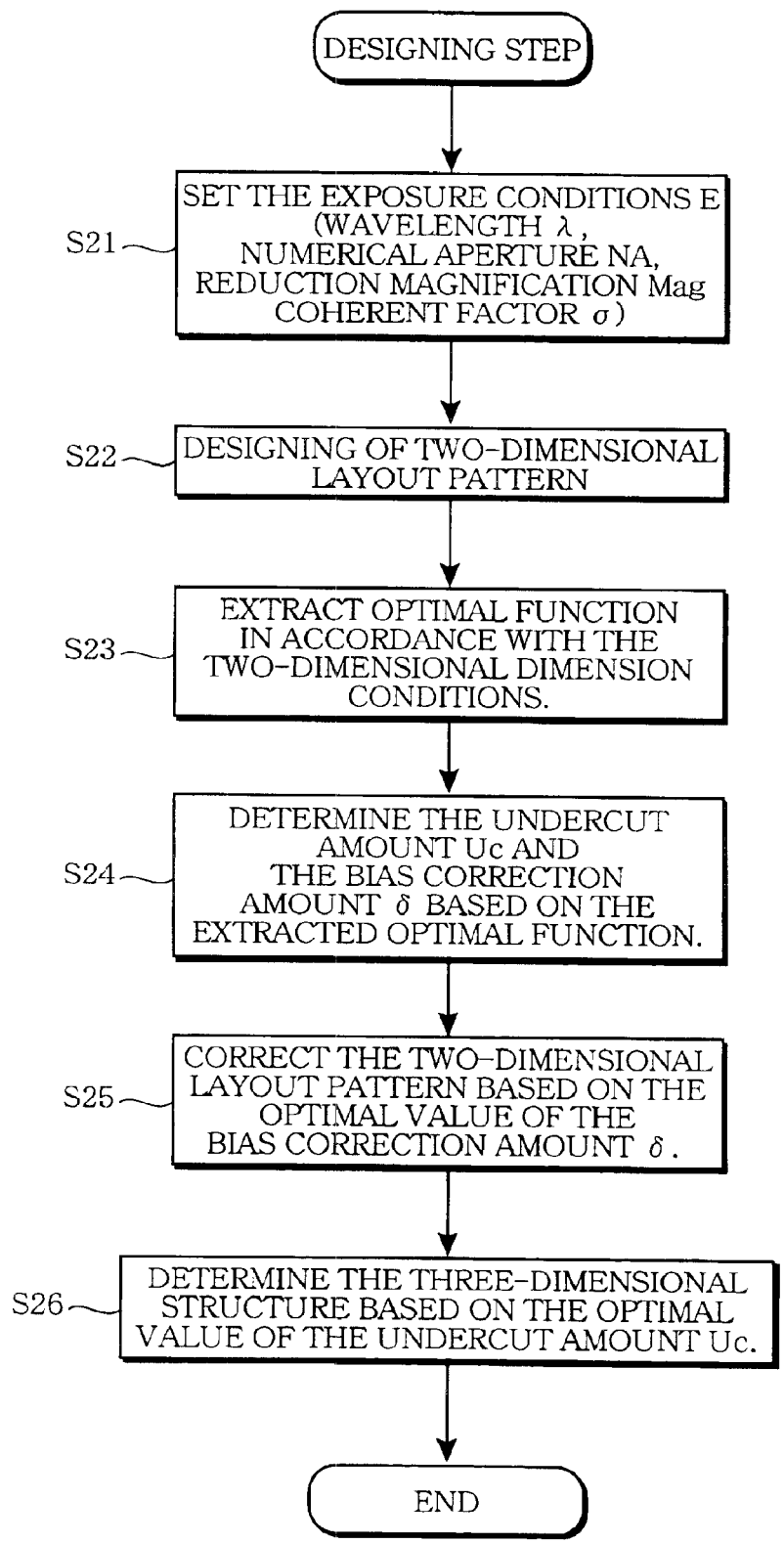
FIG. 20 is a flowchart, showing the procedures of a designing step, corresponding to the latter half of the phase shift mask designing method by this invention.

The basic principles of the designing method for phase shift mask of the present invention are as has been described above in §4. Here, the specific procedures of the designing method for phase shift mask according to the present invention shall be described with reference to the flowcharts of FIG. 19 and FIG. 20. As mentioned above, the designing method of the invention comprises a preparation step for preparing a plurality of optimal functions necessary for designing and a designing step, in which actual designing is performed using the prepared optimal functions. FIG. 19 is a flowchart, showing the procedures of the preparation step of the first half, and FIG. 20 is a flowchart, showing the procedures of the designing step of the latter half.

The individual procedures that make up the preparation step shall now be described with reference to the flowchart of FIG. 19. First in step S1, the exposure condition E for using the phase shift mask to be designed are set. The exposure condition E is an exposure condition for the process of using a phase shift mask, which has been actually manufactured upon being designed by this invention's method, to transfer a two-dimensional layout pattern onto a semiconductor wafer and specifically refers to such parameters as the exposure wavelength λ, the numerical aperture NA of the optical system used, the reduction magnification Mag, and the coherent factor σ. Here, the exposure wavelength λ in particular is used as a parameter for determining the depth d of a trench to be formed at an aperture with which phase shifting is to be performed. As mentioned above, the depth d of the trench must be set to a dimension that is necessary for shifting the phase of the transmitted light by 180 degrees and is uniquely determined based on the wavelength λ of the transmitted light.

In the following step S2, the two-dimensional dimension condition M is set. As mentioned above, here, the two-dimensional dimension condition M indicates the values of the width Wx in the X-axis direction and the width Wy in the Y-axis direction of each aperture and the width Ws of each opaque part. An example in which the respective values have been set to specific values as the k-th set of two-dimensional dimension condition Mk, is shown in the graph of FIG. 15. For the convenience of description, in the flowchart of FIG. 19, all of the K sets of two-dimensional dimension conditions, "M1, . . . , Mk, . . . , MK," are defined and a process of setting the initial value of the parameter k to 1 is performed in this step S2. Thereafter, until the parameter k reaches K, the parameter k is incremented by 1 through steps S11 and S12 and the same processes are executed repeatedly for all of the K sets of two-dimensional dimension conditions M1 to MK.

In the following step S3, a process of setting a plurality of undercut amounts Uc is performed. For example, in determining optimal functions based on a table such as that shown in FIG. 14, seventeen undercut amounts are set at increments of 10 nm from Uc=0.0 to 160.0 nm. For the convenience of description, in the flowchart of FIG. 19, all of J different undercut amounts "Uc1, . . . , Ucj, . . . , UcJ" are defined and a process of setting the initial value of the parameter j to 1 is performed in this step S3. Thereafter, until the parameter j reaches J, the parameter j is incremented by 1 through steps S8 and S9 and the same processes are executed repeatedly for all of the J different undercut amounts Uc1 to UcJ.

In the following step S4, a process of setting a plurality of bias correction amounts δ is performed. For example, in determining optimal functions based on a table such as that shown in FIG. 14, thirteen bias correction amounts are set at increments of 5 nm from δ=0.0 to 60.0 nm. For the convenience of description, in the flowchart of FIG. 19, all of I different bias correction amounts, "δ1, . . . , δi, . . . , δI" are defined and a process of setting the initial value of the parameter i to 1 is performed in this step S4. Thereafter, until the parameter i reaches I, the parameter i is incremented by 1 through steps S6 and S7 and the same processes are executed repeatedly for all of the I different bias correction amounts δ1 to δI.

Step S5 is a part that can be called an essential process of the preparation step, and here, a process of executing a three-dimensional analysis is performed under a specific condition to determine the light intensity deviation D. That is, a two-dimensional layout, with which a plurality of apertures of the same size are disposed along the X-axis, is defined on the X-Y plane based on a dimension condition obtained by applying corrections in accordance with the i-th bias correction amount δi, indicated by the parameter i, on the k-th set of two-dimensional dimension condition Mk, indicated by the parameter k, and a three-dimensional structure concerning an aperture, with which phase shifting is to be performed, is defined based on the j-th undercut amount Ucj, indicated by the parameter j, and the trench depth d, which is determined based on the exposure condition E (exposure wavelength λ). A light intensity deviation Dijk, which indicates the difference in the intensities of the light transmitted, under the exposure condition E, through each of a pair of adjacent apertures designed so that the phases will be shifted mutually by 180 degrees using the defined two-dimensional layout and the three-dimensional structural body defined by the three-dimensional structure, is then determined.

The light intensity deviation Dijk that has thus been determined is a value obtained under a specific combination of parameter values i, j, and k. Since as mentioned above, the parameter value i is incremented by 1 in steps S6 and S7, the parameter value j is incremented by 1 in steps S8 and S9, and the parameter value k is incremented by 1 in steps S11 and S12, values of the light intensity deviation D are determined respectively for a total of (I×J×K) cases in the final stage. Here, as mentioned above, the light intensity deviation D may be defined as the difference obtained by subtracting a parameter value that indicates the intensity of light that has been transmitted through one aperture from a parameter value that indicates the intensity of light that has been transmitted through the other aperture.

Though in the description up until now, this three-dimensional analysis process in step S5 is executed by simulation using a computer to obtain the light intensity deviation D as a value computed by a computer, the three-dimensional analysis does not necessarily have to be performed in the form of a computer simulation. That is, a three-dimensional structural body defined by a specific combination of the parameter values i, j, and k may be prepared and an experiment of actually illuminating light under the exposure condition E onto this physically prepared three-dimensional body may be performed to determine the light intensity deviation D as a value that is actually measured in this experiment. However, since different three-dimensional structural bodies must be physically prepared respectively for the number of combinations of the parameter values i, j, and k, it is practical to perform the three-dimensional analysis by computer simulation in a case where the values of I, J, and K, which indicate the variations of the respective parameter values, are set to comparatively large values.

The (I×J) values of the light intensity deviation D that is obtained for a specific value of the parameter k will, for example, be as those shown in the table of FIG. 14. An optimal function Fk can be determined from such a table as has been described above. That is, an optimal function is a function, which expresses the optimal value of the bias correction amount δ with respect to the undercut amount Uc when the optimal value of the bias correction amount δ for a specific undercut amount Uc is defined as the value by which the absolute value of the light intensity deviation D is minimized for the specific undercut amount Uc. In the process of step S10, the optimal function Fk for the parameter k is determined. Though the optimal function Fk may be defined as a table that indicates the correspondence between specific undercut amounts Uc and specific bias correction amounts δ that are the optimal values for the specific undercut amounts Uc, the optimal function Fk may also be defined as an equation of the form f(Uc, d), by using a least-squares method or other approximation method. As mentioned above, for practical use, the upper limit of the undercut amount Uc and the upper limit of the bias correction amount δ are preferably defined according to each set of two-dimensional dimension condition M and to define the definition range and value range of the respective optimal functions to be less than or equal to the respective upper limits.

Thus by executing the preparation step shown in the flowchart of FIG. 19, optimal functions F1 to FK are determined respectively for a total of K sets of two-dimensional dimension conditions M1 to MK. Indeed, the purpose of this preparation step is to determine these K optimal functions F1 to FK.

The individual procedures that make up the designing step shall now be described with reference to the flowchart of FIG. 20. First in step S21, the exposure condition E for using the phase shift mask that is to be designed are set. Since the same condition as the exposure condition E set in step S1 of FIG. 19 must be set, it can be said that the process of this step S21 is practically completed already in step S1.

Next in step S22, the designing of a two-dimensional layout pattern is performed. That is, a process is carried out in which a two-dimensional layout pattern, having a plurality of apertures disposed on a two-dimensional plane, is designed and whether or not phase shifting is to be performed is determined for each aperture. Specifically, dimensions of the respective parts of the two-dimensional layout pattern are defined as shown in FIG. 9 and the phase of each aperture is set to φ=0 degree or φ=180 degrees. Needless to say, the two-dimensional layout pattern that is designed here is a pattern based on dimensions of an ideal case in which it is deemed that there are no effects of the light L4, shown in FIG. 6, which leak out from the side faces of a trench 210, and is thus a pattern prior to correction based on the bias correction amount δ. Since the arts for designing such a two-dimensional layout pattern are well known and various devices for designing two-dimensional layout patterns are used, detailed descriptions thereof shall be omitted here.

In the following step S23, a process of selecting, from among the total of K sets of two-dimensional dimension conditions M1 to MK that were set in the preparation step, a condition that is applicable to the two-dimensional layout pattern that was designed in step S22 and extracting the optimal function that is determined for the selected two-dimensional dimension condition is performed. For example, if the values of the dimension condition of the two-dimensional layout pattern, such as those shown in FIG. 9, are set so that Wx=400 nm, Wy=4000 nm, and Ws=400 nm, the k-th set of two-dimensional dimension condition Mk, such as that shown in FIG. 15, is selected, and the optimal function Fk, such as that indicated by the solid line in FIG. 16, is extracted.

In step S24, a process of determining the optimal values of the undercut amount Uc and the bias correction amount δ based on the extracted optimal function is performed. The specific method of the determination process is as has been described already in §4. Needless to say, in step S23, a plurality of optimal functions Fk maybe extracted as necessary upon defining the priorities, and in this case, the determination of the optimal values is performed based on the plurality of optimal functions in step S24. Also, though for practical purposes, it is preferable to use a single optimal value of the undercut amount Uc, the optimal values of the bias correction amount δ may be set to unique values according to the respective dimension conditions.

In the following step S25, corrections are made on the two-dimensional layout pattern that was designed in step S22 based on the optimal value of the bias correction amount δ determined in step S24. In step S26, a three-dimensional structure is determined based on the optimal value of the undercut amount Uc that was determined in step S24. Actually, the trench depth d is determined based on the exposure wavelength λ included among the exposure condition E set in step S21 and a three-dimensional structure, such as that shown in the upper-diagram of FIG. 8, is determined by this depth d and the undercut amount Uc.

When the two-dimensional layout pattern after correction has been finalized in step S25 and the three-dimensional structure has been finalized in step S26, the physical structure of the phase shift mask is finalized and the designing work is completed.

As mentioned above, by this invention's designing method for phase shift mask, though much labor and time will be required in the preparation step illustrated in the flowchart of FIG. 19, once this preparation step is carried out and the necessary optimal functions are prepared, the designing step illustrated in the flowchart of FIG. 20 can be executed smoothly, thereby enabling the work load spent on designing a phase shift mask to be lightened and the working time to be reduced.

<<<§6. The Designing Device of the Invention >>>

Lastly, the basic arrangement of this invention's designing device for phase shift mask shall be described with reference to the block diagram of FIG. 21. A phase shift mask, which is to be designed by this designing device, has a substrate 200, with a transparent property, and an opaque layer 100, which is formed on the substrate and has an opaque property as shown in FIG. 2. And as shown in FIG. 1, a plurality of rectangular apertures 110 are formed on opaque layer 100 and a two-dimensional layout pattern is formed by opaque parts, made up by the regions at which the opaque layer is formed, and transparent parts, made up by regions at which apertures are formed. In addition, as shown in the upper diagram of FIG. 8, for a pair of adjacently disposed apertures, in order so that the phase of light transmitted through one aperture 112 will be shifted by 180 degrees with respect to the phase of light transmitted through the other aperture 111, a trench of depth d with an outline greater than the outline of the one aperture 112 is formed at the substrate portion at which aperture 112 is formed.

A phase shift mask with such a structure is called a trench-type, Levenson-type phase shift mask and this invention's designing device for phase shift mask is a device that is suited for the designing of a phase shift mask with such a structure.

This designing device has functions for carrying out the designing step illustrated in the flowchart of FIG. 20, and as illustrated, comprises a two-dimensional layout pattern designing tool 10, an optimal function extracting tool 20, an optimal function database 30, an undercut amount/bias correction amount determining tool 40, a three-dimensional structure determining tool 50, and a two-dimensional layout pattern correcting tool 60. These components are actually components that are realized by computer hardware and software and the entire designing device is also arranged using a computer.

Two-dimensional layout pattern designing tool 10 is a tool for executing step S22 of FIG. 20. That is, by providing various instructions to this two-dimensional layout pattern designing tool 10, an operator can design a two-dimensional layout pattern, with which a plurality of apertures are disposed on the X-Y plane, and set, for each aperture, whether or not phase shifting is to be performed. Such a tool itself is known and thus a detailed description of the internal arrangement of two-dimensional layout pattern designing tool 10 shall be omitted here.

Here, for the convenience of description, it shall be deemed that a two-dimensional layout pattern 11, containing two types of pattern 11p and 11s as illustrated, is designed by this two-dimensional layout pattern designing tool 10. Here 11p is a pattern with which a plurality of apertures are disposed in accordance with primary dimension condition Mp, and 11s is a pattern with which a plurality of apertures are disposed in accordance with secondary dimension condition Ms.

Optimal function database 30 is a storage tool in which the total of K optimal functions F1 to FK, which are prepared in the preparation step illustrated in the flowchart of FIG. 19, are stored in the form of a database. Optimal function extracting tool 20 has the function of extracting prescribed optimal functions from among the optimal functions stored in optimal function database 30 based on an instruction from an operator and is a tool for executing step S23 of FIG. 20. Specifically, first based on an instruction from the operator, a two-dimensional dimension condition that is applicable to two-dimensional layout pattern 11, designed by two-dimensional layout pattern designing tool 10, is selected and then a process of extracting the optimal function concerning the selected two-dimensional dimension condition is performed.

Figure 21:
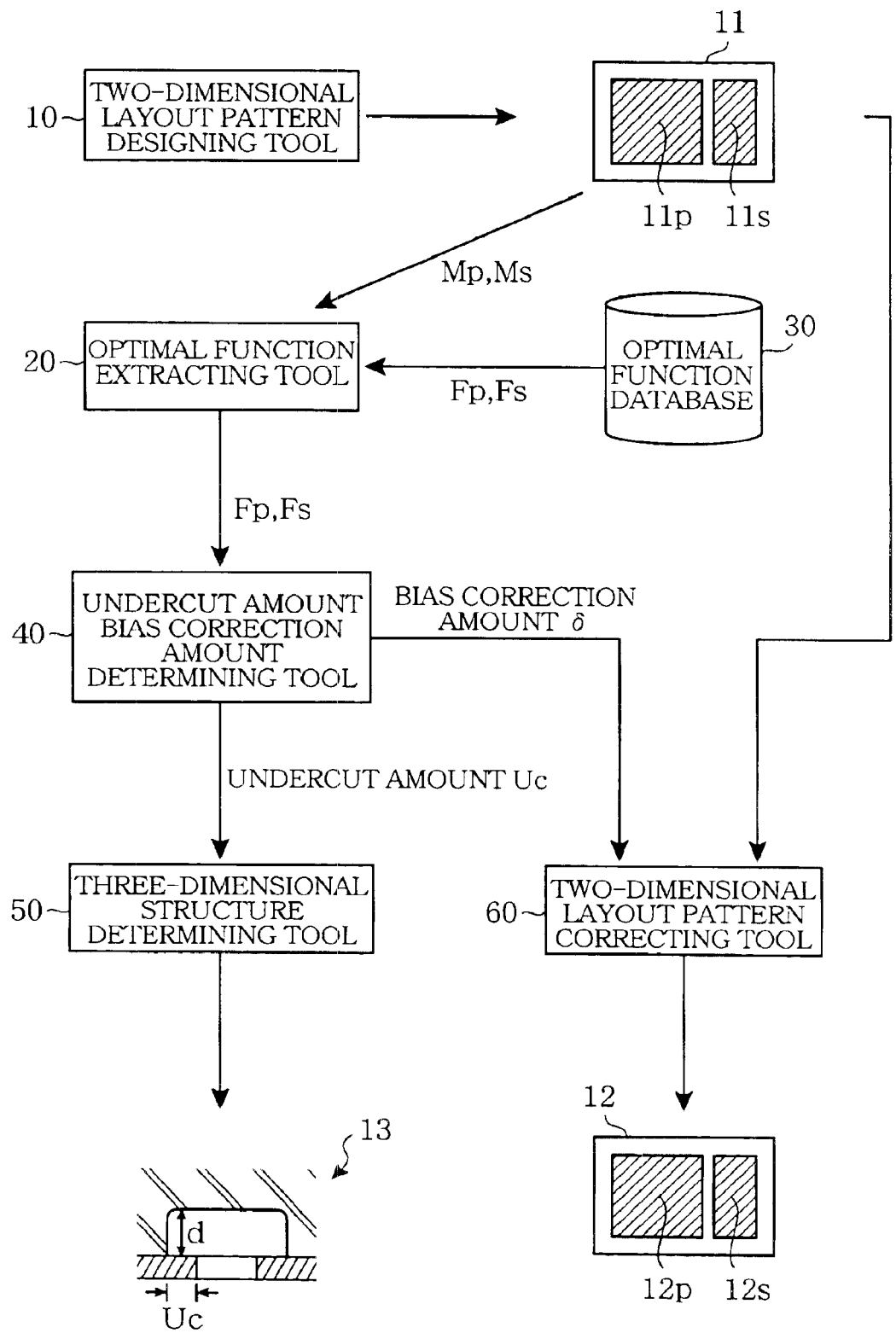
FIG. 21 is a block diagram, showing the basic arrangement of a phase shift mask designing device by this invention.

For example, in the case of the example shown in FIG. 21, two-dimensional layout pattern 11 comprises a pattern 11p with primary dimension condition Mp and a pattern 11s with secondary dimension condition Ms. Since the operator can recognize, by examining this two-dimensional layout pattern 11, that primary dimension condition Mp and secondary dimension condition Ms can be applied, the operator performs the operation of providing the instruction of selecting these two sets of dimension conditions Mp and Ms to optimal function extracting tool 20. Based on this instruction, optimal function extracting tool 20 carries out a process of extracting, from optimal function database 30, the optimal functions Fp and Fs that respectively correspond to the dimension conditions Mp and Ms. In providing the instruction for selecting the dimension conditions Mp and Ms, the operator may also perform the operation of setting priorities according to the respective sets of dimension conditions. For example in the case of the illustrated two-dimensional layout pattern 11, since the area of the pattern 11p region is greater than the area of the pattern 11s region, the priority of the dimension condition Mp may be set higher than the priority of the dimension condition Ms.

Undercut amount/bias correction amount determining tool 40 has a function performing a process of determining the undercut amount Uc and the bias correction amount δ based on the extracted optimal functions and is a tool for executing step S24 of FIG. 20. For the determination process performed by this tool, there are cases where instructions of the operator are required and cases where such instructions are not required.

That is, in a case where a specific undercut amount Uc and a specific bias correction amount δ can be determined uniquely by execution of a computing process based on a predetermined algorithm, the determination process can be carried automatically at undercut amount/bias correction amount determining tool 40 without instruction and operation by the operator. For example, when the graphs Fp and Fs of two extracted optimal functions have an intersection Q as in the example shown in FIG. 17, the coordinates of this intersection can be computed to automatically determine the optimal value of the undercut amount Uc to be 43 and the optimal value of the bias correction amount δ to be 12. Also, even in a case where the graphs Fp and Fs of two extracted optimal functions do not have an intersection as in the example shown in FIG. 18, by performing an algorithm, wherein the coordinate value of 50 nm of the abscissa position at which these graphs approach each other the most is set as the undercut amount Uc and the average value of the ordinate values of the intersections Qp and Qs of a vertical line V drawn at the abovementioned abscissa position with the respective graphs is set as the bias correction amount δ as described above, the optimal values can be determined uniquely without the instruction of the operator. The same applies to cases where priorities are defined for the respective optimal functions.

On the other hand, in a case where there is a degree of freedom in the algorithm for determining the optimal values and the optimal values cannot be determined uniquely by just a process based on this algorithm, the instruction and operation of the operator will be necessary. For example, if only one optimal function is extracted, the degree of freedom of the determination of the undercut amount Uc will be considerably high. Specifically, if an optimal function Fk, such as that shown in FIG. 16, is provided, the optimal values of the undercut amount Uc and the bias correction amount δ cannot be determined uniquely. For such a case, undercut amount/bias correction amount determining tool 40 is provided with a function of receiving instruction inputs from the operator while displaying a graph Fk, such as shown in FIG. 16, on a display screen and a function of determining the undercut amount Uc and the bias correction amount δ based on the instruction inputs of the operator. For example, by enabling the designation of a single, arbitrary point on the graph Fk shown in FIG. 16 by a mouse-click operation, etc., on the display screen by the operator, the undercut amount Uc can be determined based on the abscissa of the designated point and the bias correction amount δ can be determined based on the ordinate of the designated point.

Since the optimal value of the undercut amount Uc also cannot be determined uniquely in a case where the approach of setting a plurality of optimal values of the bias correction amount δ is taken with the example shown in FIG. 18, undercut amount/bias correction amount determining tool 40 is provided with a function of receiving instruction inputs from the operator while displaying graphs Fp and Fs, such as shown in FIG. 18, on a display screen and a function of determining the undercut amount Uc and the bias correction amount δ based on the instruction inputs of the operator for this case as well. For example, by enabling the designation of a single, arbitrary point on the abscissa of the graph shown in FIG. 18 by a mouse-click operation, etc., on the display screen by the operator, the undercut amount Uc can be determined based on the abscissa of the designated point and unique optimal values of the bias correction amount δ can be determined respectively for dimension conditions Mp and Ms based on the intersections of a vertical line drawn at the abovementioned abscissa position and the respective graphs Fp and Fs.

Three-dimensional structure determining tool 50 has a function of determining the three-dimensional structure concerning the aperture for performing phase shifting based on the undercut amount Uc determined by undercut amount/bias correction amount determining tool 40 and the trench depth d determined based on the predetermined exposure condition E, and is a tool for executing step S26 of FIG. 20. In the Figure, the condition where a three-dimensional structural body 13 with an undercut amount Uc and a depth d is defined.

Two-dimensional layout pattern correcting tool 60 has a function of correcting the two-dimensional layout pattern 11, designed at two-dimensional layout pattern designing tool 10, based on the bias correction amounts δ determined by undercut amount/bias correction amount determining tool 40, and is a tool for executing step S25 of FIG. 20. In the Figure, the condition where a corrected two-dimensional layout pattern 12 has been obtained is shown. In a case where unique bias correction amounts δ are determined according to dimension conditions Mp and Ms at undercut amount/bias correction amount determining tool 40, corrections using mutually different bias correction amounts δ are performed on pattern 11p and pattern 11s among the two-dimensional patterns 11 to provided corrected patterns 12p and 12s.

As has been described above, by this invention's designing method and designing device for phase shift mask, the work load spent on designing a phase shift mask can be lightened and the working time can be reduced.

What is claimed is:

1. A method for designing a phase shift mask, said phase shift mask having a substrate with a transparent property and an opaque layer having an opaque property formed on the substrate, wherein a plurality of rectangular apertures are formed in said opaque layer, a two-dimensional layout pattern is formed by opaque parts comprising regions at which said opaque layer is formed and transparent parts comprising regions at which said apertures are formed, and for a pair of adjacently disposed apertures, a trench having a predetermined depth and an outline greater than an outline of an aperture is formed at a portion of the substrate at which a first aperture is formed so that a phase of light transmitted through the first aperture will be shifted by 180 degrees with respect to a phase of light transmitted through a second aperture:

said phase shift mask designing method comprising a
preparation step for preparing a function necessary for designing and a designing step in which designing is actually carried out using said function;

said preparation step comprising:

an exposure condition setting step for setting an exposure condition for use of the phase shift mask to be designed;

a two-dimensional dimension condition setting step for defining an X-Y plane having an X-axis and a Y-axis on a surface of said substrate and setting a two-dimensional dimension condition M that determines specific dimension values for a width Wx in the X-axis direction and a width Wy in the Y-axis direction of each aperture and a width Ws of each opaque part;

an undercut amount setting step for setting an undercut amount Uc that indicates a distance between a position of an outline of the trench and a position of an outline of the aperture;

a bias correction amount setting step for setting a bias correction amount δ that indicates an amount of increase or decrease of an aperture width that is set by said two-dimensional dimension condition M;

a three-dimensional analysis step for executing, on each of a plurality of cases in which said two-dimensional dimension condition M, said undercut amount Uc, and said bias correction amount δ are changed in a plurality of ways, a three-dimensional analysis of defining a two-dimensional layout, in which a plurality of apertures of the same size are disposed along the X-axis on said X-Y plane based on a dimension condition obtained by applying a correction in accordance with a predetermined bias correction amount δ on the predetermined dimension condition M, defining a three-dimensional structure for an aperture with which phase shifting is to be performed based on a predetermined undercut amount Uc and a trench depth d that is determined based on said exposure condition, and determining a light intensity deviation D, which indicates, for a case where light is transmitted under said exposure condition through a pair of adjacent apertures that have been designed using a three-dimensional structural body that is defined by said two-dimensional layout and said three-dimensional structure, a difference in intensities of light that has been transmitted through said pair of adjacent apertures; and an optimal function defining step for comparing a plurality of light intensity deviations D, which have been determined under a specific two-dimensional dimension condition M in said three-dimensional analysis step, with each other, determining, for each of a plurality of undercut amounts Uc, a bias correction amount δ by which the light intensity deviation D is minimized as an optimal value for said specific two-dimensional dimension condition M, and determining, for each of a plurality of two-dimensional dimension conditions M, an optimal function that indicates an optimal value of a bias correction amount δ with respect to an undercut amount Uc; and said designing step comprising:

a two-dimensional layout pattern designing step for designing a two-dimensional layout pattern, wherein a plurality of apertures are disposed on a two-dimensional plane, and determining for each aperture, whether or not phase shifting is to be performed;

an optimal function extracting step for selecting, from among a plurality of two-dimensional dimension conditions M for which the optimal functions are determined, a condition that can be applied to said two-dimensional layout pattern and extracting an optimal function determined for the selected two-dimensional dimension condition M;

an optimal value determination step for determining optimal values of an undercut amount Uc and a bias correction amount δ based on the extracted optimal function;

a layout correction step for correcting said two-dimensional layout pattern based on said optimal value of the bias correction amount δ; and a three-dimensional structure determination step for determining a three-dimensional structure for an aperture with which phase shifting is to be performed based on said optimal value of the undercut amount Uc and a trench depth d that is determined based on the exposure condition.

2. The phase shift mask designing method as set forth in claim 1, wherein the three-dimensional analysis step is executed by simulation using a computer and the light intensity deviations D are obtained as values computed by a computer.

3. The phase shift mask designing method as set forth in claim 1, wherein the three-dimensional analysis step is executed by experiments of actually illuminating light onto a physically prepared three-dimensional structural bodies and the light intensity deviations D is obtained as values that are actually measured in these experiments.

4. The phase shift mask designing method as set forth in claim 1, wherein in the three-dimensional analysis step, the light intensity deviation D is defined as a difference obtained by subtracting, from a parameter value indicating an intensity of light transmitted through a first aperture, a parameter value indicating an intensity of light transmitted through a second aperture; and in the optimal function defining step, the bias correction amount δ, with which an absolute value of a light intensity deviation D for a specific undercut amount Uc is minimized, is set as an optimal value for said specific undercut amount Uc.

5. The phase shift mask designing method as set forth in claim 1, wherein in the optimal function defining step, an upper limit of an undercut amount Uc and an upper limit of a bias correction amount δ are defined for each two-dimensional dimension condition M and a definition range and a value range of each optimal function are defined to be less than or equal to the corresponding upper limit.

6. The phase shift mask designing method as set forth in claim 1, wherein in the optimal function defining step, an optimal function is defined as a table indicating a correspondence between specific undercut amounts Uc and specific bias correction amounts δ that are optimal values for the specific undercut amounts Uc.

7. The phase shift mask designing method as set forth in claim 1, wherein in the optimal function defining step, an optimal function is defined as an equation that approximates a correspondence between specific undercut amounts Uc and specific bias correction amounts δ that are optimal values for the specific undercut amounts Uc.

8. The phase shift mask designing method as set forth in claim 1, wherein in the optimal function extracting step, a plurality of two-dimensional dimension conditions M are selected to extract a plurality of optimal functions; and in the optimal value determining step, two-dimensional graphs of said plurality of optimal functions are defined by setting an undercut amount Uc as an abscissa and a bias correction amount δ as an ordinate, an optimal value of the undercut amount Uc is set to a coordinate value of an abscissa position at which the plurality of graphs approach each other the most, and an optimal value of the bias correction amount δ is set to an average value of ordinate values of intersections of a vertical line drawn at said abscissa position and the respective graphs.

9. The phase shift mask designing method as set forth in claim 8, wherein in the optimal function extracting step, a plurality of two-dimensional dimension conditions M are selected upon defining respective priorities to extract a plurality of optimal functions with the respective priorities being defined; and in the optimal value determining step, an optimal value of the bias correction amount δ is determined as an average value that takes into consideration the respective priorities of the graphs of the optimal functions.

10. The phase shift mask designing method as set forth in claim 1, wherein in the optimal function extracting step, a plurality of two-dimensional dimension conditions M are selected to extract a plurality of optimal functions; and in the optimal value determining step, two-dimensional graphs of said plurality of optimal functions are defined by setting an undercut amount Uc as an abscissa and a bias correction amount δ as an ordinate, a coordinate value of a predetermined abscissa position is set as a single optimal value of the undercut amount Uc in common to said plurality of two-dimensional dimension conditions M, and for the bias correction amount δ, a unique optimal value is determined for each two-dimensional dimension condition M based on an ordinate value of an intersection of a vertical line drawn at said abscissa position and a corresponding graph, respectively.

11. The phase shift mask designing method as set forth in claim 1, wherein as the bias correction amount δ, a first correction amount δ1, which indicates an amount of increase of a dimension of an aperture with which phase shifting is to be performed, and a second correction amount δ2, which indicates an amount of decrease of a dimension of an aperture with which phase shifting is not to be performed, are set.

12. The phase shift mask designing method as set forth in claim 11, wherein the first correction amount δ1 and the second correction amount δ2 are set to an equal value.

* * * * *